(12) United States Patent
Matsuo et al.

(10) Patent No.: US 10,418,968 B2
(45) Date of Patent: Sep. 17, 2019

(54) ELECTRONIC COMPONENT MANUFACTURING METHOD, VIBRATOR DEVICE, ELECTRONIC APPARATUS, AND VEHICLE

(71) Applicant: SEIKO EPSON CORPORATION, Tokyo (JP)

(72) Inventors: Atsushi Matsuo, Okaya (JP); Takayuki Kikuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 311 days.

(21) Appl. No.: 15/299,218

(22) Filed: Oct. 20, 2016

(65) Prior Publication Data

US 2017/0126200 A1    May 4, 2017

(30) Foreign Application Priority Data

Oct. 28, 2015    (JP) .................................. 2015-211600

(51) Int. Cl.
| | | |
|---|---|---|
| *B81C 1/00* | (2006.01) | |
| *H03H 9/215* | (2006.01) | |
| *H01L 21/308* | (2006.01) | |
| *H01L 41/04* | (2006.01) | |
| *H03H 3/02* | (2006.01) | |
| *H03H 9/05* | (2006.01) | |
| *H03H 9/17* | (2006.01) | |
| *H03H 9/21* | (2006.01) | |

(52) U.S. Cl.
CPC .............. *H03H 9/215* (2013.01); *H03H 3/02* (2013.01); *H03H 9/05* (2013.01); *H03H 9/0595* (2013.01); *H03H 9/17* (2013.01); *H03H 9/21* (2013.01); *H03H 2003/026* (2013.01)

(58) Field of Classification Search
None
See application file for complete search history.

(56) References Cited

U.S. PATENT DOCUMENTS

| | | | |
|---|---|---|---|
| 2011/0193647 A1 | 8/2011 | Minegishi | |
| 2012/0120458 A1* | 5/2012 | Hino | .................... G02B 26/085 358/474 |
| 2015/0180448 A1 | 6/2015 | Ichikawa | |
| 2016/0204334 A1* | 7/2016 | Yamada | ................ H01L 41/042 310/317 |

FOREIGN PATENT DOCUMENTS

| | | |
|---|---|---|
| JP | 2003-198303 A | 7/2003 |
| JP | 2006-060727 A | 3/2006 |

(Continued)

*Primary Examiner* — Shamim Ahmed
(74) *Attorney, Agent, or Firm* — Oliff PLC

(57) ABSTRACT

An electronic component manufacturing method, in which a notch and a concave portion are formed in a substrate, includes forming an etching mask in which a maximum width of a first mask portion which forms a width between two side surfaces of the concave portion along a longitudinal direction, when the substrate is seen in a plan view from a direction perpendicular to a surface of the substrate having the concave portion formed therein, is smaller than a width of a second mask portion which forms a minimum width of an opening of the notch, and forming the notch and the concave portion by performing dry etching processing on the substrate.

6 Claims, 13 Drawing Sheets

(56) References Cited

FOREIGN PATENT DOCUMENTS

| | | |
|---|---|---|
| JP | 2007-013382 A | 1/2007 |
| JP | 2007-013383 A | 1/2007 |
| JP | 2007-166242 A | 6/2007 |
| JP | 2008-205657 A | 9/2008 |
| JP | 2010-010734 A | 1/2010 |
| JP | 2010-178169 A | 8/2010 |
| JP | 2011-166325 A | 8/2011 |
| JP | 2011-199330 A | 10/2011 |
| JP | 2013-005072 A | 1/2013 |
| JP | 2013-187639 A | 9/2013 |
| JP | 2013-191981 A | 9/2013 |
| JP | 2013-229733 A | 11/2013 |
| JP | 2014-107603 A | 6/2014 |
| JP | 2014-165910 A | 9/2014 |
| JP | 2015-118027 A | 6/2015 |
| WO | 2010/023741 A1 | 3/2010 |

* cited by examiner

ELECTRONIC COMPONENT MANUFACTURING METHOD, VIBRATOR DEVICE, ELECTRONIC APPARATUS, AND VEHICLE

CROSS-REFERENCE TO RELATED APPLICATIONS

This application claims priority to Japanese Patent Application No. 2015-211600, filed Oct. 28, 2015, the entirety of which is hereby incorporated by reference.

BACKGROUND

1. Technical Field

The present invention relates to an electronic component manufacturing method, a vibrator device, an electronic apparatus including the vibrator device, and a vehicle including the vibrator device.

2. Related Art

In recent years, as portable devices and the like have become widespread, there has been a demand for a reduction in the size of a vibrator device used therefor. In a small-sized piezoelectric device, for example, a small-sized tuning fork type vibrator element, a configuration has been known in which a bottomed groove (concave portion) is provided in a vibration unit and an exciting electrode is disposed within the groove in order to achieve efficient flexural vibration. As a method of forming a vibration unit (vibrator element) having such a configuration, a method is disclosed in which a piezoelectric substrate (piezoelectric wafer) is processed by a dry etching method to thereby form a vibration unit (vibrator element) (see, for example, JP-A-2015-118027).

However, in the method of forming a vibration unit (vibrator element) which is disclosed in JP-A-2015-118027, a groove (concave portion) formed in the vibration unit is formed to have a bottom, that is, is configured as a non-penetration groove, and thus it is difficult to simultaneously form the exterior (penetration portion) of the vibration unit to be penetrated and the groove (non-penetration portion) not to be penetrated, by a dry etching method. For this reason, in the processing of the groove, the groove is formed using a processing step or the like using a wet etching method, which is a process different from a processing step using a dry etching method. Thereby, there is a problem in that the processing step of the vibration unit (vibrator element) becomes complicated, which results in an increase in the number of steps for processing.

SUMMARY

An advantage of some aspects of the invention is to solve at least a part of the problems described above, and the invention can be implemented as the following aspects or application examples.

Application Example 1

An electronic component manufacturing method according to this application example is a method of manufacturing an electronic component in which a notch and a concave portion extending in a longitudinal direction when seen in a plan view are formed in an exterior by dry etching processing. The method includes preparing a substrate, forming, on the substrate, an etching mask in which a width of a first mask portion which forms a maximum width between two side surfaces of the concave portion along the longitudinal direction is smaller than a width of a second mask portion which forms a minimum width of an opening of the notch, and an etching process of performing the dry etching processing on the substrate and forming the concave portion together with the notch.

In the dry etching processing, an etching rate of a portion having a reduced opening width of a mask is smaller than an etching rate of a portion having an increased opening width of the mask. In other words, an etching speed of the portion having a reduced opening width of the mask is lower than an etching speed of the portion having an increased opening width of the mask.

According to this application example, the dry etching processing is performed using an etching mask formed such that the width of the first mask portion which forms the maximum width between the two side surfaces of the concave portion is smaller than the width of the second mask portion which forms the minimum width of the opening of the notch. Therefore, the etching rate of the notch becomes higher than the etching rate of the concave portion, and thus the etching of the notch proceeds at a higher speed than the etching of the concave portion. Thereby, when the etching processing is terminated at a point in time when the notch can be formed, a bottomed concave portion can be formed. In this manner, it is possible to form the notch as a penetration portion and the bottomed concave portion by the same dry etching processing, to solve complication in processing of a vibration unit (vibrator element), and to contribute to a reduction in the number of processes.

Meanwhile, a longitudinal direction in this specification refers to a direction in which the exterior is formed by the notch and protrusion is performed from a portion which is a starting point of a portion having the concave portion provided therein, in other words, refers to an extension direction of the portion having the concave portion provided therein. In addition, in a case where a plurality of concave portions are provided lined up, a direction in which the plurality of concave portions are lined up is referred to as a longitudinal direction.

Application Example 2

In the method of manufacturing an electronic component according to the application example, it is preferable that the first mask portion is formed so that the width thereof becomes smaller toward an end of the opening of the concave portion in the longitudinal direction in the forming of the etching mask.

According to this application example, the first mask portion is formed so as to have a width decreasing toward the end of the opening of the concave portion in the longitudinal direction. Since an etching rate becomes lower as the width becomes smaller, it is possible to easily provide a curved inclination at the end of the opening of the concave portion in the longitudinal direction. The end of the opening of the concave portion in the longitudinal direction is configured as a curved inclination, and thus it is possible to increase the stiffness of the portion having the concave portion formed therein and to improve resistance to, for example, torsional deformation.

Application Example 3

In the method of manufacturing an electronic component according to the application example, it is preferable that the first mask portion and the second mask portion are formed so that the minimum width of the opening of the notch becomes larger by equal to or greater than 10 µm than the maximum width between the two side surfaces of the concave portion and a minimum width between the two side surfaces of the concave portion is set to equal to or less than 50 µm, in the forming of the etching mask.

The minimum width of the opening of the notch is set to larger by equal to or greater than 10 µm with respect to the minimum width of the concave portion, and thus it is possible to make a difference in an etching rate conspicuous. In addition, when the minimum width of the concave portion exceeds 50 µm, the concave portion is configured as a penetration portion which is the same as the notch, and thus there is a concern that a concave portion having a bottom cannot be formed.

According to this application example, it is possible to form the concave portion having a bottom and the notch by the same dry etching processing.

Application Example 4

In the method of manufacturing an electronic component according to the application example, it is preferable that the first mask portion is formed so that the minimum width of the concave portion is set to be equal to or less than 30 µm, in the forming of the etching mask.

According to this application example, the width of the notch becomes smaller as the width of the concave portion becomes smaller, and thus it is possible to form a smaller electronic component. In addition, the minimum width of the concave portion is set to equal to or less than 30 µm, and thus it is possible to increase a ratio of the curved inclination formed at the end of the concave portion to the width of the concave portion.

Application Example 5

In the method of manufacturing an electronic component according to the application example, it is preferable that the electronic component is a vibrator element, the vibrator element includes a base, a vibrator arm disposed so as to protrude toward the same direction from the base, the notch defined by the exterior, and the concave portion formed in the vibrator arm, and an electrode formation process of forming an electrode in the vibrator arm is performed after the dry etching processing.

According to this application example, it is possible to form the base, the vibrator arm, the concave portion formed in the vibrator arm, and the notch defined by exteriors of the base and the vibrator arm by the same dry etching processing and to configure the vibrator element including the electrode formed in the vibrator arm after the dry etching processing.

Application Example 6

A vibrator device according to this application example includes a base, vibrator arms disposed so as to protrude toward the same direction from the base, and concave portions respectively provided in the vibrator arms so as to have a non-penetration portion. An opening of the concave portion is configured such that the length thereof in a direction perpendicular to the width of the opening is larger than the width, and the width is smaller than a minimum width between side surfaces defining an exterior shape. The concave portion is configured such that a cross-section thereof along the direction of the length has a curved shape extending toward an opening from a bottom.

According to this application example, the opening of the concave portion provided in the vibrator arm so as to have a non-penetration portion is configured such that the length of the opening in a direction perpendicular to the width thereof is larger than the width, and the width is smaller than a minimum width between side surfaces defining an exterior shape. In addition, the concave portion is configured such that a cross-section thereof along the direction of the length has a curved shape extending toward an opening from a bottom. It is possible to provide stiffness to torsional deformation and the like and to achieve efficient flexural vibration by including the vibrator arm including such a concave portion, and thus it is possible to provide the vibrator device having stable vibration characteristics in spite of its small size.

Meanwhile, the lengthwise direction in this specification refers to a direction along a direction in which the vibrator arm protrudes from the base, and can be rephrased as a longitudinal direction. In addition, the width of the opening in this specification refers to a dimension in a direction perpendicular to the lengthwise direction which is an extension direction of the concave portion, and refers to a dimension at a position where the concave portion comes into contact with the surface or rear surface thereof. In other words, an opening width of the concave portion is an interval between inner side surfaces of the concave portion along the surface or rear surface thereof.

Application Example 7

In the vibrator device according to the application example, it is preferable that the concave portion is configured such that the width becomes smaller toward the end thereof which is positioned in the direction of the length of the opening.

According to this application example, the stiffness of the vibrator arm provided with the concave portion is increased, and thus torsional deformation and the like are not likely to occur, thereby allowing vibration to be stabilized.

Application Example 8

In the vibrator device according to the application example, it is preferable that a depth of the non-penetration portion in the concave portion is equivalent to 20% or more of a thickness of the vibrator arm.

According to this application example, the area of the electrode provided within the concave portion can be increased while securing the stiffness of the vibrator arm, and thus it is possible to increase the stability and efficiency of vibration and to achieve an improvement in vibration characteristics of the vibrator device, for example, a reduction in a CI value which is a characteristic indicating the easiness of vibration.

Application Example 9

In the vibrator device according to the application example, it is preferable that the concave portion includes the non-penetration portion and a penetration portion, and the penetration portion is configured such that an opening on the bottom side is smaller than the opening of the concave portion.

According to this application example, the concave portion opens so as to extend toward the opening side thereof, and thus it is possible to facilitate the formation of the electrode.

Application Example 10

In the vibrator device according to the application example, it is preferable that a plurality of the concave portions are provided along the direction of the length.

According to this application example, the stiffness of the vibrator arm can be increased, and thus it is possible to provide the vibrator device with improved impact resistance to falling or the like.

Application Example 11

An electronic apparatus according to this application example includes the vibrator device according to any one of the application examples described above.

According to this application example, the vibrator device having a small size and stable vibration characteristics is provided, and thus it is possible to realize the highly-reliable electronic apparatus with a reduced fluctuation in characteristics and a suppressed fluctuation in aging characteristics (for example, a change in frequency with time) and the like.

Application Example 12

A vehicle according to this application example includes the vibrator device according to any one of the application examples described above.

According to this application example, the vibrator device having a small size and stable vibration characteristics is provided, and thus it is possible to realize the highly-reliable vehicle with a reduced fluctuation in characteristics and a suppressed fluctuation in aging characteristics (for example, a change in frequency with time) and the like.

BRIEF DESCRIPTION OF THE DRAWINGS

The embodiments of the invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. Meanwhile, in the following drawings, each layer and each member are drawn in scales different from actual scales in such a way that the layer and the member are drawn in recognizable sizes. In addition, in FIGS. 1 to 17 except for FIGS. 4 and 7, an X-axis, a Y-axis, and a Z-axis are shown as three axes perpendicular to each other for convenience of description, and a tip end side of an arrow of each of the axes is set as a "positive (+) side" and a base end side is set as a "negative (−) side". In addition, in the following description, a direction parallel to the X-axis will be referred to as an "X-axis direction", a direction parallel to the Y-axis will be referred to as a "Y-axis direction", and a direction parallel to the Z-axis will be referred to as a "Z-axis direction". In addition, in the following description, a plan view when seen from the Z-axis direction will be simply referred to as "when seen in a plan view" for convenience of description.

First Embodiment

Configuration of Vibrator device

Figure 1:
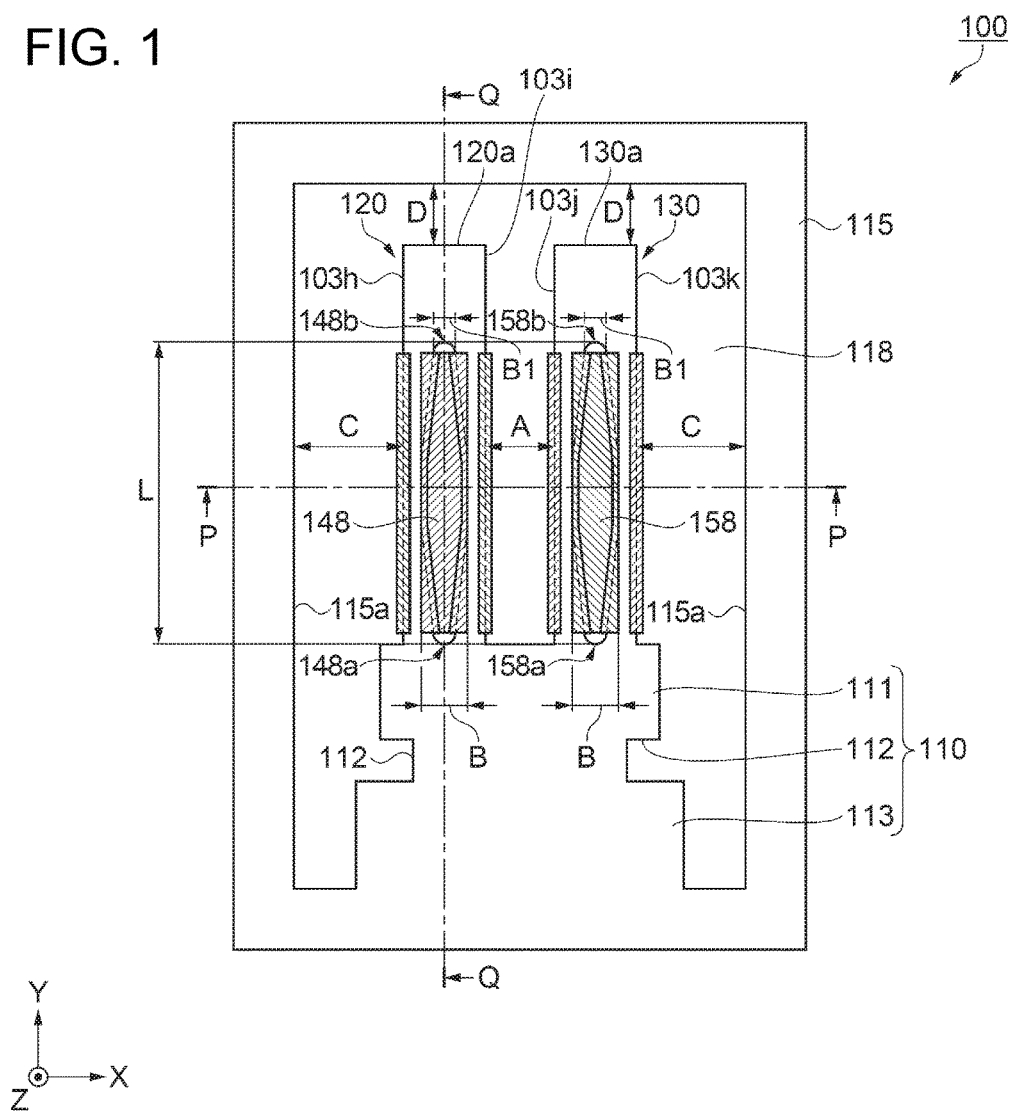
FIG. 1 is a schematic plan view showing a configuration of a tuning fork type vibrator element of a vibrator device as an electronic component according to a first embodiment.
Figure 2:
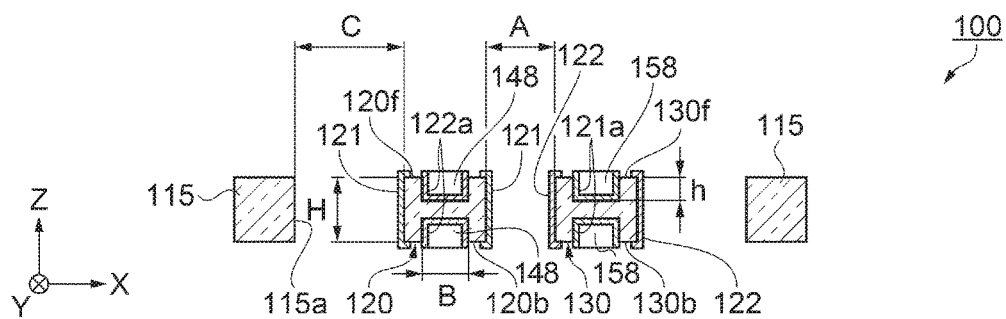
FIG. 2 is a cross-sectional view taken along line P-P of FIG. 1.

First, a tuning fork type vibrator element is taken as an example of a vibration element of a vibrator device as an example of an electronic component according to a first embodiment, and a schematic configuration thereof will be described with reference to FIGS. 1 to 3. FIG. 1 is a schematic plan view showing a configuration of the tuning fork type vibrator element of the vibrator device as an electronic component according to the first embodiment. FIG. 2 is a cross-sectional view taken along line P-P of FIG.

1. FIG. 3 is a cross-sectional view taken along line Q-Q of FIG. 1. Meanwhile, for convenience of description, other electrodes except for a drive electrode are not shown in FIG. 1, and a drive electrode is not shown in FIG. 3.

Figure 3:
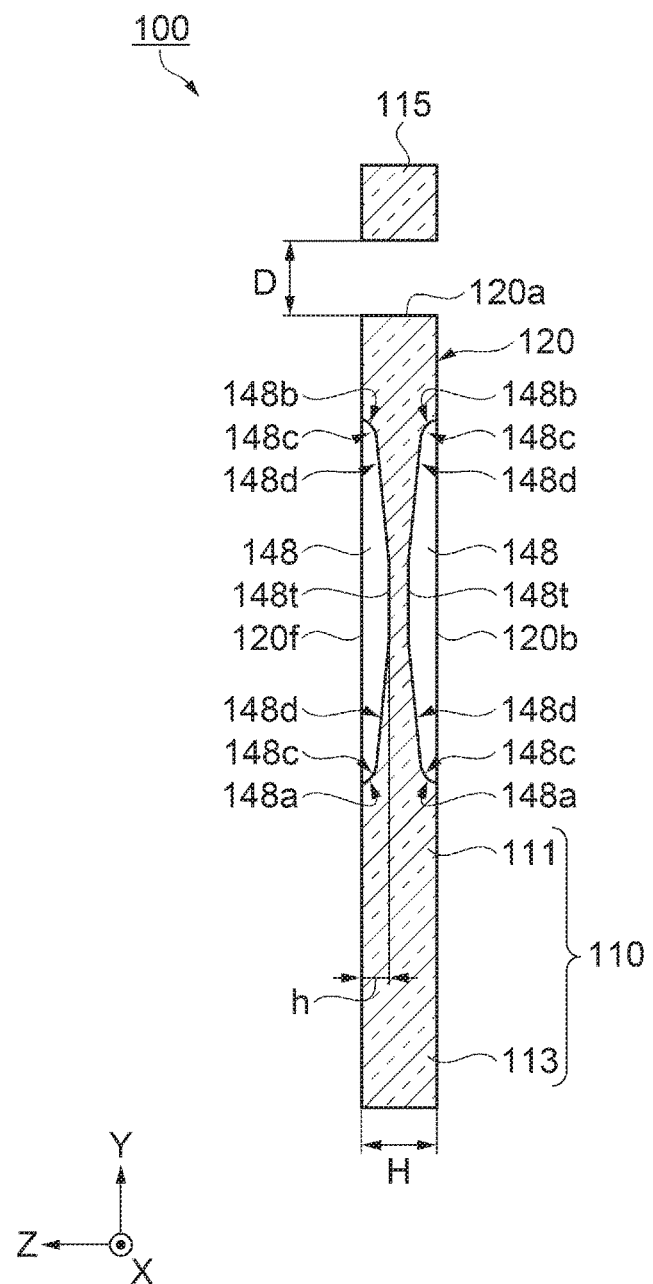
FIG. 3 is a cross-sectional view taken along line Q-Q of FIG. 1.

As shown in FIGS. 1 to 3, a tuning fork type vibrator element 100 includes a base 110, a pair of vibrator arms 120 and 130 that extend so as to protrude from the base 110 in the +Y-axis direction, and a frame 115 that extends from the base 110 and surrounds the vibrator arms 120 and 130. Here, the exterior such as the base 110, the vibrator arms 120 and 130, and the frame 115 is defined by a notch 118. Meanwhile, hereinafter, a description will be given with a direction (direction along the Y-axis direction) along a direction in which the vibrator arms 120 and 130 protrude from the base 110 as a lengthwise direction, an extension direction, or a longitudinal direction, and a description will be given with a direction (X-axis direction) which is perpendicular to the direction (direction along the Y-axis direction) along the direction in which the vibrator arms 120 and 130 protrude from the base 110 as a width direction.

The base 110 has a flat plate shape including a narrow portion 111 and a wide portion 113 that are disposed with a constricted portion 112 interposed therebetween. Meanwhile, the base 110 may have a shape in which the constricted portion 112 is not provided, that is, a substantially rectangular flat plate shape. The vibrator arms 120 and 130 are a pair of prism-like vibration bodies that extend in the Y-axis direction from an end on the +Y side of the narrow portion 111 in the base 110 so as to be substantially parallel to each other. That is, the base 110 is a portion which is a starting point of each of the vibrator arms 120 and 130 protruding from the base 110 in the same direction. The base 110, the vibrator arms 120 and 130, and the frame 115 that constitute the tuning fork type vibrator element 100 are integrally formed, and quartz crystal is used as a base material. Meanwhile, the tuning fork type vibrator element 100 of the first embodiment can be formed by a photolithography method and a dry etching method using fluorine-based gas or the like.

Quartz crystal has an X-axis called an electric axis, a Y-axis called a machine axis, and a Z-axis called an optical axis. A base material constituting the tuning fork type vibrator element 100 is processed into a flat plate shape by being cut out along a plane specified by the X-axis and the Y-axis perpendicular to each other in a quartz crystal axis, and has a predetermined thickness in the Z-axis direction perpendicular to the plane. The base material which is rotated and cut out in a range of 0 degrees to 2 degrees with respect to the X-axis may be used. The predetermined thickness is appropriately set on the basis of a vibration frequency, an exterior size, processability, and the like.

The base 110, the vibrator arms 120 and 130, and the frame 115 are formed with intervals (widths) between side surfaces that define the respective exterior shapes. Meanwhile, in this embodiment, as an example of an interval (width) between side surfaces defining each of the exterior shapes, a distance between the vibrator arm 120 and the vibrator arm 130 shown in FIG. 1, that is, between a side surface 103i of the vibrator arm 120 and a side surface 103j of the vibrator arm 130 is shown as an interval A, a distance between each of the vibrator arms 120 and 130 and the frame 115, that is, between each of a side surface 103h of the vibrator arm 120 and a side surface 103k of the vibrator arm 130 and a side surface 115a of the frame 115 is shown as an interval C, and a distance between each of end side surfaces 120a and 130a of the vibrator arms 120 and 130 in the extension direction (Y-axis direction) of the vibrator arms 120 and 130 and the side surface 115a of the frame 115 is shown as an interval D. Meanwhile, in this embodiment, a minimum width among intervals (widths) between side surfaces defining exterior shapes is set to be the interval D between each of the vibrator arms 120 and 130 in the extension direction (Y-axis direction) of the vibrator arms 120 and 130 and the frame. Meanwhile, each of the intervals A, B, C, and D is a dimension at a position where a side surface of each of the respective components comes into contact with the surface or rear surface thereof. In other words, each of the intervals A, B, C, and D is an interval along the surface or the rear surface of each component.

The vibrator arm 120 and the vibrator arm 130 vibrate in opposite directions in a direction along the plane specified by the X-axis and the Y-axis. That is, when the vibrator arm 120 is displaced toward the +X-axis direction, the vibrator arm 130 is displaced toward the −X-axis direction. When the vibrator arm 120 is displaced toward the −X-axis direction, the vibrator arm 130 is displaced toward the +X-axis direction.

The vibrator arm 120 extending from the base 110 includes a surface 120f, a rear surface 120b provided on aside opposite to the surface 120f, and side surfaces 103h and 103i that connect the surface 120f and the rear surface 120b to each other. In addition, the vibrator arm 130 extending from the base 110 includes a surface 130f, a rear surface 130b provided on a side opposite to the surface 130f, and side surfaces 103j and 103k that connect the surface 130f and the rear surface 130b to each other. The vibrator arm 120 is provided with a bottomed concave portion (groove) 148 which is dug from the surface 120f and the rear surface 120b and extends along the Y-axis direction. The vibrator arm 130 is provided with a bottomed concave portion (groove) 158 which is dug from the surface 130f and the rear surface 130b and extends along the Y-axis direction. Meanwhile, the bottoms of the concave portion 148 and the concave portion 158 constitute a non-penetration portion that does not penetrate the vibrator arms 120 and 130.

The concave portions 148 and 158 open to the surfaces 120f and 130f or the rear surfaces 120b and 130b. Openings of the concave portions 148 and 158 are configured such that a length (length dimension) L in a direction perpendicular to the width of the opening is set to be larger than a width (width dimension) B of the opening, and the width (width dimension) B of the opening is set to be smaller than the interval D which is the minimum width between the side surfaces defining the exterior shape. Meanwhile, the width B (B1) of the opening in the embodiment refers to a dimension in a direction (X-axis direction in the drawing) which is perpendicular to the lengthwise direction (Y-axis direction in the drawing) which is the extension direction of the concave portions 148 and 158, and refers to a dimension at a position where the concave portions 148 and 158 come into contact with the surfaces 120f and 130f or the rear surfaces 120b and 130b. In other words, the opening width of each of the concave portions 148 and 158 is an interval between the inner side surfaces of the concave portions 148 and 158 along the surfaces 120f and 130f or the rear surfaces 120b and 130b.

In addition, each of the concave portions 148 and 158 has a curved portion 148c which extends toward the opening (the surface 120f or the rear surface 120b) from a bottom 148t as the bottom of the concave portion 148 (158) in a shape of a cross-section along the extension direction (lengthwise direction) as shown in FIG. 3. Specifically, the concave portion 148 (158) has an inclined surface 148d of which the depth decreases toward one end 148a (158a) and the other end 148b (158b) that are positioned in the lengthwise direction from the central portion in the extension direction (lengthwise direction along the Y-axis direction), and the curved portion 148c in which the concave portion 148 (158) continuously extends toward the opening from the inclined surface 148d in a curved manner.

Meanwhile, in this embodiment, a description has been given with the concave portion 148 of the vibrator arm 120 as a representative example in FIG. 3, but the same configuration can also be adopted in the concave portion 158 of the vibrator arm 130. In addition, in this embodiment, the inclined surface 148d provided between the bottom 148t and the curved portion 148c may have a configuration in which the depth thereof changes in a curved manner, for example, a configuration in which a rounded shape continuing from the bottom 148t to the curved portion 148c is formed, instead of having a configuration in which the depth thereof changes linearly as shown in FIG. 3.

In this manner, in the opening of each of the concave portions 148 and 158, a length L in a direction perpendicular to the width B of the opening is larger than the width B, and the width B is smaller than the interval D which is the minimum width between side surfaces defining the exterior shape. In addition, in the concave portions 148 and 158, a cross-section along the lengthwise direction has a shape of a curve (curved portion 148c) extending toward the opening from the bottom 148t. It is possible to provide stiffness to torsional deformation and the like and to achieve efficient flexural vibration by including the vibrator arms 120 and 130 having such concave portions 148 and 158, and thus it is possible to provide the tuning fork type vibrator element 100 as a vibrator device having stable vibration characteristics in spite of its small size.

In addition, the opening of each of the concave portions 148 and 158 has a width (width dimension) which decreases toward one side ends 148a and 158a and the other side ends 148b and 158b that are positioned in the lengthwise direction from the central portion in the extension direction (lengthwise direction along the Y-axis direction). Specifically, the opening gradually becomes narrow from the width (width dimension) B of the central portion of the opening of each of the concave portions 148 and 158 to the width (width dimension) B1 each of one side ends 148a and 158a and the other side ends 148b and 158b. Meanwhile, in the one side ends 148a and 158a and the other side ends 148b and 158b, inner side surfaces on both sides are connected to each other in a curve shape (arc shape in this embodiment). In this manner, the inner side surfaces on both sides are connected to each other in a curve shape, and thus it is possible to suppress the concentration of stress in the one side ends 148a and 158a and the other side ends 148b and 158b and to improve impact resistance of the vibrator arms 120 and 130, as compared to a case where the inner side surfaces are connected to each other linearly.

In this manner, the opening of each of the concave portions 148 and 158 has a width (width dimension) that decreases toward the one side ends 148a and 158a and the other side ends 148b and 158b, and thus the stiffness of the vibrator arms 120 and 130 increases and torsional deformation and the like are not likely to occur, thereby allowing vibration to be stabilized.

Meanwhile, the above-mentioned width of the opening refers to a dimension in the width direction which is a direction (X-axis direction in the drawing in this embodiment) which is perpendicular to the lengthwise direction which is the extension direction (Y-axis direction in the drawing in this embodiment) of the concave portions 148 and 158, and refers to a dimension at a position where the concave portions 148 and 158 come into contact with the surface 120f or the rear surface 120b. In other words, the opening width of each of the concave portions 148 and 158 is an interval between the inner side surfaces of the concave portion 148 along the surface 120f or the rear surface 120b and is an interval between the inner side surfaces along the surface 130f or the rear surface 130b.

In addition, in the concave portions 148 and 158, it is preferable that a depth dimension h from the surfaces 120f and 130f or the rear surfaces 120b and 130b to the bottom 148t (see FIG. 3) is set to be equal to or less than 20% of a thickness dimension H (dimension in the Z-axis direction) of each of the vibrator arms 120 and 130. Meanwhile, the depth dimension h is a dimension of a deepest portion within the non-penetration portion of each of the concave portions 148 and 158, and is equivalent to the bottom 148t in this embodiment.

The depth dimension h of each of the concave portions 148 and 158 is set as described above, and thus it is possible to increase the area of each of drive electrodes 121a and 122a (see FIG. 2) provided within the concave portions 148 and 158 while securing the stiffness of the vibrator arms 120 and 130. Accordingly, it is possible to increase the stability and efficiency of vibration and to achieve an improvement in vibration characteristics of the tuning fork type vibrator element 100, for example, a reduction in a crystal impedance (CI) value which is a characteristic indicating the easiness of vibration.

Meanwhile, in this embodiment described above, a description has been given of a configuration in which the opening of each of the concave portions 148 and 158 is configured such that the width (width dimension) becomes narrow toward the one side ends 148a and 158a and the other side ends 148b and 158b, but the invention is not limited thereto. The opening of each of the concave portions 148 and 158 may be configured to have the same width (width dimension) and to face the one side ends 148a and 158a and the other side ends 148b and 158b from the central portion.

The drive electrode 121 is provided over the side surfaces 103h and 103i from a portion of the surface 120f or the rear surface 120b of the vibrator arm 120. The drive electrode 122 is provided over the side surfaces 103j and 103k from a portion of the surface 130f or the rear surface 130b of the vibrator arm 130. The drive electrode 122a is provided over both inner wall surfaces within the concave portion 148 and the bottom thereof from a portion of the surface 120f or the rear surface 120b of the vibrator arm 120. The drive electrode 121a is provided over both inner wall surfaces within the concave portion 158 and the bottom thereof from a portion of the surface 130f or the rear surface 130b of the vibrator arm 130.

Configurations of the drive electrodes 121 and 122 are not particularly limited. The drive electrodes may have conductivity and may be formed to be thin. As a specific configuration, the drive electrodes may be formed of a metal material such as gold (Au), a gold alloy, platinum (Pt), aluminum (Al), an aluminum alloy, silver (Ag), a silver alloy, chromium (Cr), a chrome alloy, copper (Cu), molybdenum (Mo), niobium (Nb), tungsten (W), iron (Fe), titanium (Ti), cobalt (Co), zinc (Zn), or zirconium (Zr), or a conductive material such as indium tin oxide (ITO). In addition, a configuration may be adopted in which a base layer such as of chromium (Cr), a chromium alloy, or nickel (Ni) is provided.

Meanwhile, although not shown in the drawing, the drive electrode 121 and the drive electrode 121a are patterned so that the same potential is supplied thereto, and the drive electrode 122 and the drive electrode 122a are patterned so that a potential opposite to those of the drive electrode 121 and the drive electrode 121a is supplied thereto. An alternating potential is applied to the drive electrodes 121 and 122 and the drive electrodes 121a and 122a that are patterned in this manner, and thus it is possible to vibrate the vibrator arms 120 and 130 in opposite directions along a plane specified by the X-axis and the Y-axis.

In addition, although not shown in the drawing, the tip end of each of the vibrator arms 120 and 130 may be provided with a weight portion as a wide portion, having a substantially rectangular shape, which is wider (has a large dimension in the X-axis direction) than the vibrator arms 120 and 130. In a configuration in which the vibrator arms 120 and 130 are provided with a weight portion as a wide portion, predetermined driving vibration can be obtained while suppressing an increase in the length (dimension in the Y-axis direction) of each of the vibrator arms 120 and 130, and thus it is possible to reduce the size of the tuning fork type vibrator element 100.

In addition, in this embodiment, a description has been given of an example in which the tuning fork type vibrator element 100 is formed of quartz crystal, but the tuning fork type vibrator element may be formed of various piezoelectric single crystal materials such as lithium tantalite and lithium niobate, other than quartz crystal.

According to the tuning fork type vibrator element 100 of the first embodiment, the length dimension L in perpendicular directions is larger than the width dimensions B and B1 of the respective openings of the concave portions 148 and 158 provided in the respective vibrator arms 120 and 130 so as to have a bottom which is a non-penetration portion, and the width dimension is smaller than a minimum width (interval D in this embodiment) between side surfaces defining an exterior shape. In addition, as shown in FIG. 3, the concave portions 148 and 158 have the curved portion 148c extending toward the opening from the bottom in the shape of a cross-section along the lengthwise direction (Y-axis direction), and thus it is possible to increase stiffness to torsional deformation of the vibrator arms 120 and 130, and the like and to achieve efficient flexural vibration.

Since the depth h of each of the concave portions 148 and 158 is set to be equal to or greater than 20% of the thickness H of each of the vibrator arms 120 and 130, it is possible to increase the area of each of the drive electrodes 121a and 122a provided within the respective concave portions 148 and 158 while securing the stiffness of the vibrator arms 120 and 130, thereby allowing the stability and efficiency of vibration to be increased.

Thereby, it is possible to provide the tuning fork type vibrator element 100 as a vibrator device in which an improvement in vibration characteristics, such as a reduction in a CI value which is a characteristic indicating the easiness of vibration, and stability are realized, in spite of its small size.

Method of Manufacturing Vibrator Device (Electronic Component)

Figure 4:
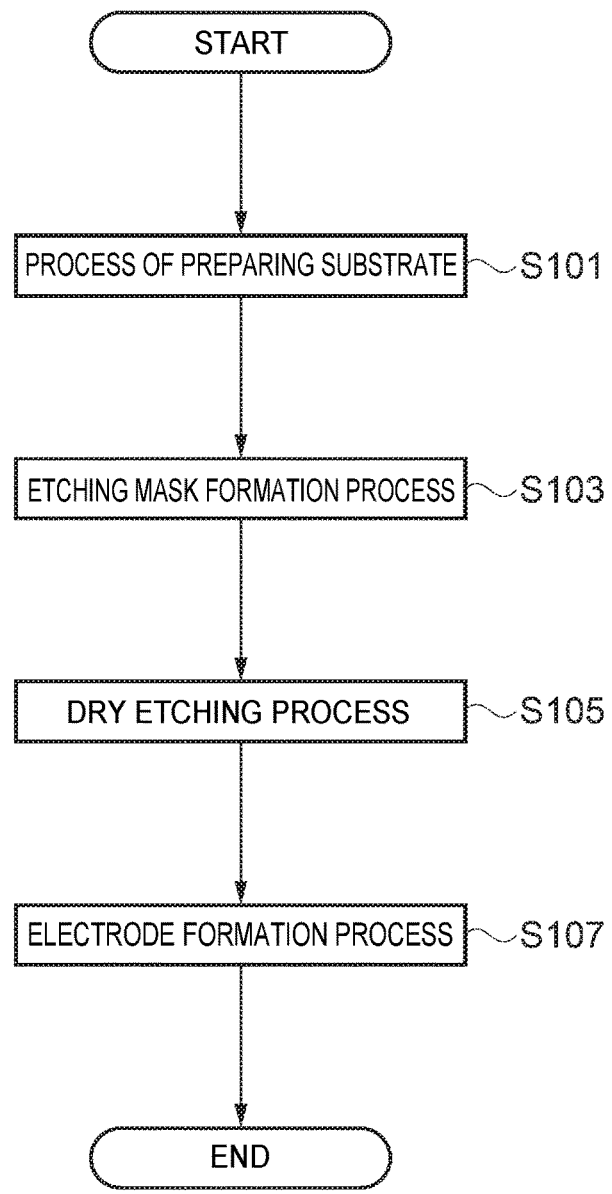
FIG. 4 is a flow chart showing a method of manufacturing the tuning fork type vibrator element of the vibrator device as an electronic component according to the first embodiment.
Figure 5:
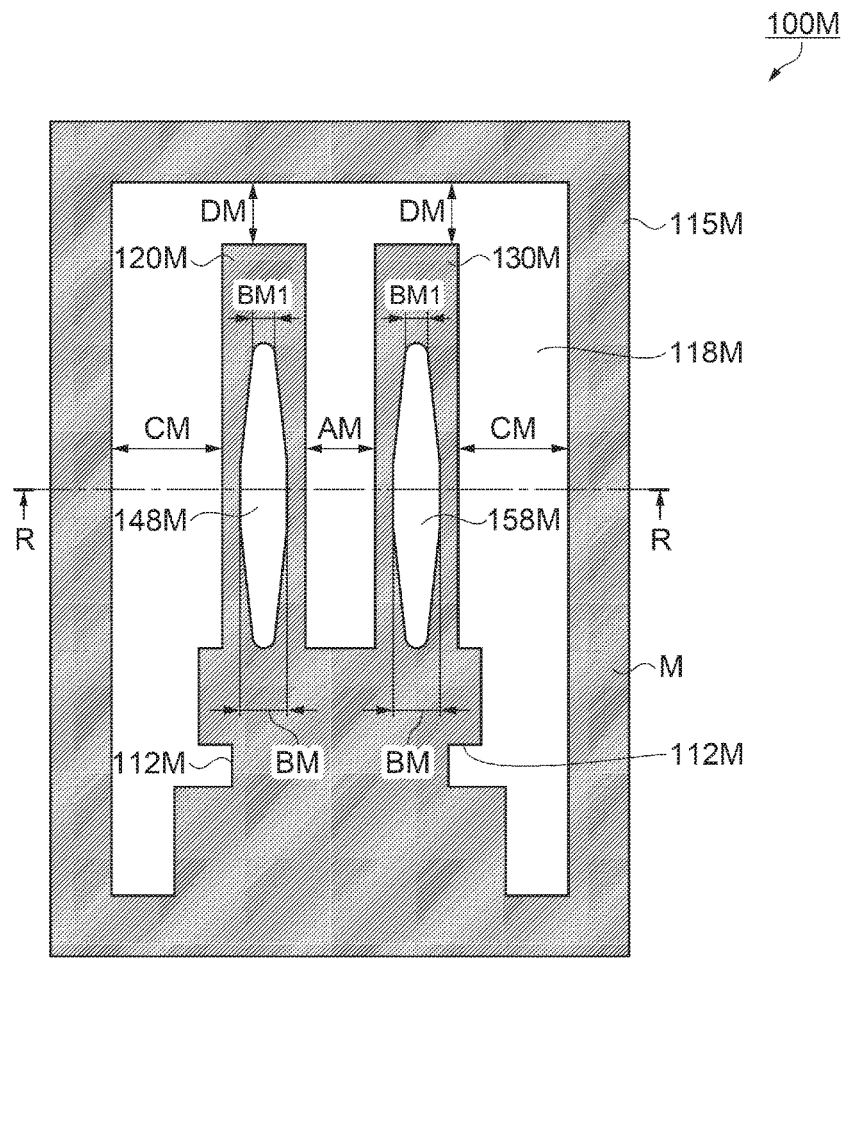
FIG. 5 is a plan view showing an etching mask which is used to manufacture the tuning fork type vibrator element.
Figure 6:
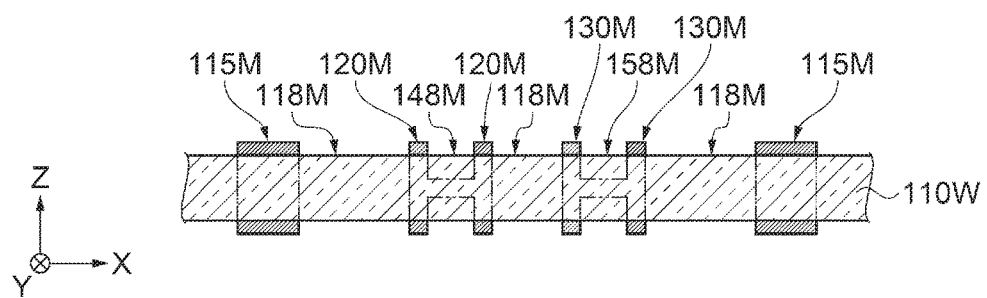
FIG. 6 is a cross-sectional view which shows a state where an etching mask is disposed and which is taken along line R-R of FIG. 5.
Figure 7:
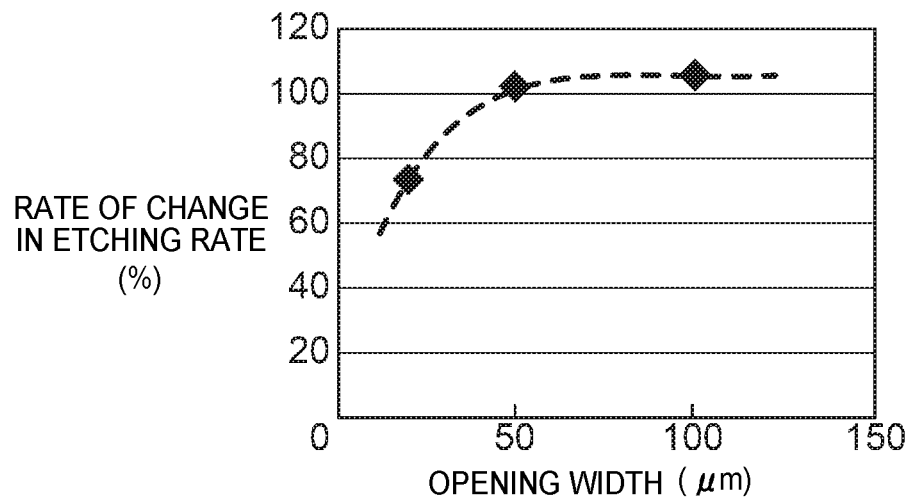
FIG. 7 is a graph showing a correlation between an opening width and an etching rate.

Next, an example of a method of manufacturing the tuning fork type vibrator element 100 of the vibrator device as the above-mentioned electronic component according to the first embodiment will be described with reference to the accompanying drawings. FIG. 4 is a flowchart showing a method of manufacturing the tuning fork type vibrator element of the electronic component (vibrator device) according to the first embodiment. FIG. 5 is a plan view showing an etching mask which is used to manufacture the tuning fork type vibrator element. Meanwhile, in FIG. 5, a portion to be masked, that is, a portion which is not to be etched is hatched. FIG. 6 is a cross-sectional view which shows a state where an etching mask is disposed on a quartz crystal substrate and which is taken along line R-R of FIG. 5. FIG. 7 is a graph showing a correlation between an opening width and an etching rate. Meanwhile, components of the tuning fork type vibrator element 100 will be described with reference to FIGS. 1 to 3. In addition, a manufacturing method to be described below is an example, and the tuning fork type vibrator element 100 can be manufactured using another manufacturing method.

As shown in FIG. 4, a method of manufacturing the tuning fork type vibrator element 100 includes a process of preparing a substrate serving as a base material of the tuning fork type vibrator element 100 (step S101), an etching mask formation process of disposing an etching mask on the substrate (step S103), a dry etching process of forming the exterior of the tuning fork type vibrator element 100 and the concave portions 148 and 158 (step S105), and an electrode formation process of disposing an electrode in the tuning fork type vibrator element 100 (step S107). Hereinafter, the processes will be sequentially described in detail.

Meanwhile, a longitudinal direction to be described below refers to a direction (extension direction of the vibrator arms 120 and 130) in which the exterior is formed by the notch 118 mentioned above and the vibrator arms 120 and 130 which are portions provided with the concave portions 148 and 158 protrude from a portion (base 110) which is a starting point, in other words, refers to an extension direction (Y-axis direction shown in FIG. 1) of the concave portions 148 and 158. In addition, in a case where a plurality of concave portions are provided lined up as in a fourth embodiment to be described later, a direction in which the plurality of concave portions are lined up is referred to as a longitudinal direction.

Process of Preparing Substrate (Step S101)

First, a substrate (quartz crystal wafer) 110W (see FIG. 5) which serves as a base material of the tuning fork type vibrator element 100 is prepared. The substrate (quartz crystal wafer) 110W is a quartz crystal Z plate which is rotated clockwise in a range between 0 degrees and 5 degrees about the Z-axis and is cut out in an orthogonal coordinate system constituted by an X-axis, a Y-axis, and a Z-axis. The substrate (quartz crystal wafer) 110W is formed by cutting and polishing the cut-out quartz crystal Z plate to a predetermined thickness. Meanwhile, exteriors of a plurality of tuning fork type vibrator elements 100 are defined from one substrate (quartz crystal wafer) 110W, and separation into individual tuning fork type vibrator elements 100 can be finally performed.

Etching Mask Formation Process (Step S103)

Next, as shown in FIG. 6, a plane-shaped etching mask 100M shown in FIG. 5 is disposed on the substrate (quartz crystal wafer) 110W. The etching mask 100M is formed of a metal film such as of nickel (Ni) as a corrosion resistant film with respect to dry etching processing to be described later, and is formed using a lift-off method or the like. It is possible to realize a mask shape having minute intervals by using a lift-off method. As shown in FIG. 5, the etching mask 100M includes first openings 148M and 158M corresponding to the concave portions 148 and 158 of the tuning fork type vibrator element 100, and a second opening 118M that defines exteriors such as the base 110 of the tuning fork type vibrator element 100, the vibrator arms 120 and 130, and the frame 115.

The first openings 148M and 158M are provided along the longitudinal direction (Y-axis direction) of the concave portions 148 and 158. The first openings 148M and 158M are formed such that the width (equivalent to a width BM1 in this example) of each of the first openings 148M and 158M (first mask portion to be described later) which form a maximum width (equivalent to a width dimension B in this example) between two side surfaces along the longitudinal direction (Y-axis direction) of the concave portions 148 and 158 becomes smaller than the width (equivalent to a width DM in this example) of the second opening 118M (second mask portion to be described later) which forms a minimum width of the opening of the notch 118.

In addition, the first openings 148M and 158M are formed so as to gradually become narrow from a width (width dimension) BM of the central portion thereof to the width (width dimension) BM1 of both ends thereof toward both ends from the central portion in the longitudinal direction (Y-axis direction in the drawing) of the concave portions 148 and 158. In addition, in the etching mask 100M, the first openings 148M and 158M are formed so that the minimum width (equivalent to the width DM in this example) of the second opening 118M corresponding to the notch 118 becomes larger by equal to or greater than 10 μm than the maximum width (equivalent to the width BM in this example) of each of the first openings 148M and 158M corresponding to the concave portions 148 and 158 and the minimum width (equivalent to the width B1 in this example) of each of the concave portions 148 and 158 of the tuning fork type vibrator element 100 is set to equal to or less than 50 μm. Meanwhile, the first openings 148M and 158M are equivalent to a first mask portion, and the second opening 118M is equivalent to a second mask portion.

As shown in the graph of FIG. 7, an etching rate of dry etching processing in the dry etching process (step S105) to be described later changes depending on an opening width of the etching mask 100M shown in the drawing. That is, according to FIG. 7, in a case where the opening width of the etching mask 100M is about 50 μm, it can be understood that the etching rate increases (becomes high) as the opening width increases, and the etching rate does not change in a high etching rate state when the opening width exceeds 50 μm. In this manner, the etching rate in the dry etching process (step S105) to be described later decreases (etching speed becomes low) as the width becomes narrow. Meanwhile, when the opening width becomes smaller than 20 μm, the etching speed is excessively reduced, or the etching does not proceed, and thus it is difficult to practically perform etching processing for forming an exterior.

Therefore, the first openings 148M and 158M as the first mask portion are formed to have a width becoming smaller toward the ends thereof in the longitudinal direction as described above, and thus it is possible to easily provide the inclined surface 148d and the curved portion 148c in the ends 148a, 148b, 158a, and 150b of the openings of the concave portions 148 and 158 in the longitudinal direction in the dry etching process (step S105) to be described later.

The ends 148a, 148b, 158a, and 150b of the openings of the concave portions 148 and 158 in the longitudinal direction are formed as curved inclinations (the inclined surface 148d and the curved portion 148c) by disposing the etching mask 100M mentioned above, and thus it is possible to increase the stiffness of portions (vibrator arms 120 and 130) having the concave portions formed therein and to improve resistance to, for example, torsional deformation.

In addition, the minimum width of the opening of the notch 118 is set to equal to or greater than 10 μm with respect to the minimum width of each of the concave portions 148 and 158 by disposing the etching mask 100M mentioned above, and thus it is possible to make a difference in an etching rate conspicuous. Meanwhile, when the minimum width of each of the concave portions 148 and 158 exceeds 50 μm, the etching rate thereof is increased and approaches the etching rate of the notch 118, which leads to concern of the concave portions 148 and 158 being penetrated. Accordingly, it is necessary to set the minimum width of each of the concave portions 148 and 158 to equal to or less than 50 μm. Therefore, the minimum width of each of the concave portions 148 and 158 is set to equal to or less than 50 μm, and thus it is possible to form the concave portions 148 and 158 and the notch 118 by the same dry etching process.

In addition, it is preferable to form the first openings 148M and 158M as a first mask portion so that the minimum width of each of the concave portions 148 and 158 of the tuning fork type vibrator element 100 is set to equal to or less than 30 μm. In this manner, the width of the notch 118 can be reduced by reducing the width of each of the concave portions 148 and 158, and thus it is possible to form the tuning fork type vibrator element 100 having a small size. In addition, the minimum width of each of the concave portions 148 and 158 is set to equal to or less than 30 μm, and thus it is possible to increase a ratio of the curved inclinations (the inclined surface 148d and the curved portion 148c) which are formed in the ends 148a, 148b, 158a, and 158b of the concave portions 148 and 158 to the widths (width dimensions) of the concave portions 148 and 158.

Dry Etching Process (step S105)

Next, dry etching processing is performed on the substrate (quartz crystal wafer) 110W (see FIG. 5) having the etching mask 100M formed thereon (step S105). The notch 118 is formed at a position equivalent to the mask 118M of the etching mask 100M: by the dry etching process (step S105), and the exterior of the tuning fork type vibrator element 100 including the base 110, the vibrator arms 120 and 130, the frame 115, and the like is defined by the notch 118. In addition, the bottomed concave portions 148 and 158 are formed at positions equivalent to the masks 148M and 158M of the etching mask 100M: by the dry etching process (step S105). Meanwhile, the tuning fork type vibrator element 100 is an example of a vibrator element, and can also be applied to other types of vibrator elements. In the dry etching processing, an etching gas such as $C_4F_8$ (cyclobutane octafluoride), $C_2F_6$ (hexafluoroethane), $SF_6$ (sulfur hexafluoride), or $CF_4$ (carbon tetrafluoride) can be used. In this embodiment, an example in which dry etching processing is performed using a $C_4F_8$ (cyclobutane octafluoride) gas is described.

The dry etching process (step S105) is performed using the etching mask 100M disposed by the above-mentioned etching mask formation process (step S103), and thus it is possible to form the notch 118 and the concave portions 148 and 158 by one dry etching processing. That is, the exterior of the tuning fork type vibrator element 100, including the base 110, the vibrator arms 120 and 130, the frame 115, and the like, which is defined by the notch 118 and the bottomed concave portions 148 and 158 provided in the vibrator arms 120 and 130 can be formed by the same etching processing.

Electrode Formation Process (step S107)

Next, various electrodes are formed in the tuning fork type vibrator element 100 of which the exterior is defined (step S107). In the electrode formation process (step S107), a conductive material to be described later is disposed in at least the vibrator arms 120 and 130 by using, for example, a sputtering method, a deposition method, or the like, thereby forming the drive electrodes 121, 122, 121a, and 122a. As shown in FIGS. 1 and 2, the drive electrode 121 is provided over the side surfaces 103h and 103i from a portion of the surface 120f or the rear surface 120b of the vibrator arm 120. The drive electrode 122 is provided over the side surfaces 103j and 103k from a portion of the surface 130f or the rear surface 130b of the vibrator arm 130. The drive electrode 121a is provided over both inner wall surfaces within the concave portion 148 and the bottom thereof from a portion of the surface 120f or the rear surface 120b of the vibrator arm 120. The drive electrode 122a is provided over both inner wall surfaces within the concave portion 158 and the bottom thereof from a portion of the surface 130f or the rear surface 130b of the vibrator arm 130. Meanwhile, the drive electrode 121 and the drive electrode 121a are patterned so that the same potential is supplied thereto, and the drive electrode 122 and the drive electrode 122a are patterned so that a potential opposite to those of the drive electrode 121 and the drive electrode 121a is supplied thereto.

The drive electrodes 121 and 122 may be formed of a metal material such as gold (Au), a gold alloy, platinum (Pt), aluminum (Al), an aluminum alloy, silver (Ag), a silver alloy, chromium (Cr), a chrome alloy, copper (Cu), molybdenum (Mo), niobium (Nb), tungsten (W), iron (Fe), titanium (Ti), cobalt (Co), zinc (Zn), or zirconium (Zr), or a conductive material such as indium tin oxide (ITO). In addition, a configuration may be adopted in which a base layer such as of chromium (Cr), a chromium alloy, or nickel (Ni) is provided.

Meanwhile, although a description will be omitted here, other electrodes such as a connection electrode connecting the drive electrodes 121, 122, 121a, and 122a to each other, an external connection electrode, and a drawing electrode connecting the drive electrodes 121, 122, 121a, and 122a and the external connection electrode to each other can be similarly formed.

The above-mentioned dry etching process (step S105) and electrode formation process (step S107) are applied, and thus the notch 118 defined by the exteriors of the base 110, the vibrator arms 120 and 130, and the frame 115 and the concave portions 148 and 158 formed in the vibrator arms 120 and 130 can be formed by the same dry etching processing. In addition, it is possible to form electrodes such as the drive electrodes 121, 122, 121a, and 122a formed in the vibrator arms 120 and 130 after the dry etching processing. In this manner, it is possible to easily form the tuning fork type vibrator element 100 as a vibrator element.

According to the tuning fork type vibrator element 100 as the above-mentioned electronic component (vibrator device), dry etching processing is performed using the etching mask 100M formed such that the width BM of the first mask portion (first openings 148M and 158M) which forms the maximum width between two side surfaces of the concave portions 148 and 158 is smaller than the minimum width DM of the second mask portion (second opening 118M) which determines the opening of the notch 118. Therefore, an etching speed of the notch 118 (equivalent to the second opening 118M) becomes higher than an etching speed of each of the concave portions 148 and 158 (first openings 148M and 158M), and thus the etching of the notch 118 proceeds at a higher speed than the etching of each of the concave portions 148 and 158. Thereby, when the etching processing is terminated at a point in time when the notch 118 can be formed, the bottomed concave portions 148 and 158 can be formed. In this manner, it is possible to form the notch 118 as a penetration portion and the bottomed (non-penetration) concave portions 148 and 158 by the same dry etching processing, to solve complication in a processing step of the vibrator device (tuning fork type vibrator element 100 as a vibrator element), and to contribute to a reduction in the number of processes.

Second Embodiment

Figure 8:
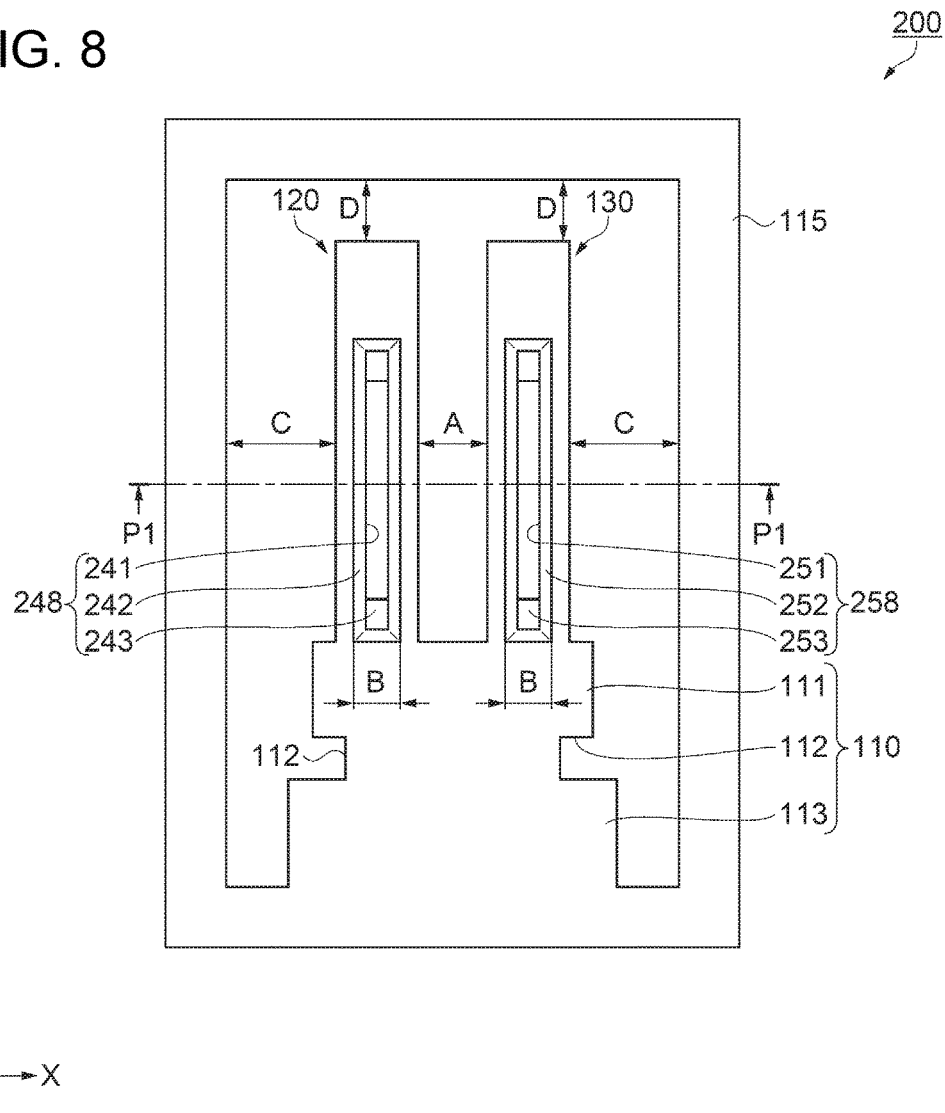
FIG. 8 is a schematic plan view showing a configuration of a tuning fork type vibrator element of an electronic component (vibrator device) according to a second embodiment.
Figure 9:
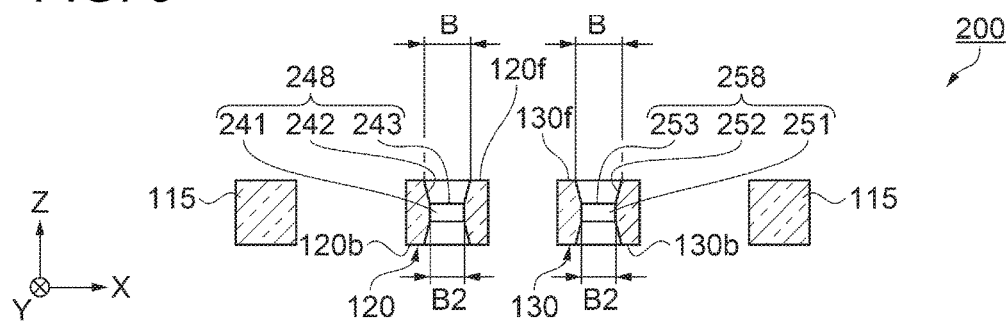
FIG. 9 is a cross-sectional view taken along line P1-P1 of FIG. 8.
Figure 10:
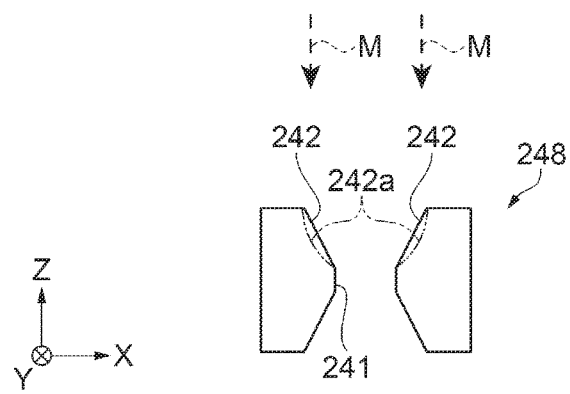
FIG. 10 is an enlarged view of a vibrator arm in a cross-section taken along line P1-P1 of FIG. 8.

Next, a schematic configuration of a tuning fork type vibrator element of an electronic component (vibrator device) according to a second embodiment will be described with reference to FIGS. 8 to 10. FIG. 8 is a schematic plan view showing a configuration of the tuning fork type vibrator element of the electronic component (vibrator device) according to the second embodiment. FIG. 9 is a cross-sectional view taken along line P1-P1 of FIG. 8. FIG. 10 is an enlarged view of a vibrator arm in a cross-section taken along line P1-P1 of FIG. 8. Meanwhile, for convenience of description, an electrode such as a drive electrode is not shown in FIGS. 8 to 10. Hereinafter, the same components as those in the above-described first embodiment are denoted by the same reference numerals and signs, and thus a description thereof will not be repeated.

As shown in FIGS. 8 to 10, a tuning fork type vibrator element 200 according to the second embodiment includes a base 110, a pair of vibrator arms 120 and 130 that extend so as to protrude from the base 110 in the +Y-axis direction, and a frame 115 that extends from the base 110 and surrounds the vibrator arms 120 and 130, similar to the first embodiment. Meanwhile, details of a configuration of the tuning fork type vibrator element 200 are the same as those in the first embodiment, and thus a description thereof will not be repeated. The tuning fork type vibrator element 200 according to the second embodiment is different from the tuning fork type vibrator element 100 according to the first embodiment in terms of configurations of concave portions 248 and 258 respectively provided in the vibrator arms 120 and 130. Hereinafter, a description will be given focusing on the concave portions 248 and 258 configured in a different manner.

The concave portions 248 and 258 respectively provided in the vibrator arms 120 and 130 open to surfaces 120f and 130f or rear surfaces 120b and 130b. The concave portions 248 and 258 include bottomed non-penetration portions 243 and 253, bottomed inclined surfaces (inner walls) 242 and 252 that are inclined so as to extend up to an XY plane on an opening side, and penetration portions 241 and 251 that penetrate the concave portion 248 and the concave portion 258. The concave portions 248 and 258 are configured such that the openings thereof have a rectangular shape extending along a protrusion direction (Y-axis direction) of the vibrator arms 120 and 130, the Y-axis direction is set as a longitudinal direction, and a direction (X-axis direction) which is perpendicular to the longitudinal direction (lengthwise direction) is set as a lateral direction (width direction). The openings of the concave portions 248 and 258 are configured such that a length (length dimension) L in the longitudinal direction is set to be larger than a width (width dimension) B of the opening in the lateral direction, and the width (width dimension) B of the opening is set to be smaller than an interval D which is the minimum width between side surfaces defining the exterior shape thereof. Meanwhile, the width B of the opening in the embodiment is a dimension of each of the concave portions 248 and 258 that respectively come into contact with the surfaces 120f and 130f or the rear surfaces 120b and 130b.

In addition, the penetration portions 241 and 251 of the respective concave portions 248 and 258 include the bottomed inclined surfaces (inner walls) 242 and 252 of the concave portions 248 and 258 which are inclined so as to extend up to an XY plane on the opening side. In other words, the concave portions 248 and 258 are configured such that the width dimension B of the opening thereof is larger than a width dimension B2 of the bottom thereof. In this manner, as shown in FIG. 10, the concave portions 248 and 258 open on the opening side, and thus an electrode material to be supplied tends to be attached to the inner walls (inclined surfaces 242 and 252) of the concave portions 248 and 258 at the time of forming an electrode using, for example, a sputtering method, a deposition method, or the like, thereby allowing the formation of an electrode to be facilitated.

Meanwhile, regarding a cross-sectional shape of each of the concave portions 248 and 258, the shape of a cross-section along the extension direction (lengthwise direction) may have a curved portion which is a curve extending toward the opening (the surface 120f or the rear surface 120b) from the bottom of each of the concave portions 248 and 258, or an inclined surface, similar to the first embodiment. Similarly to the first embodiment, a configuration may also be adopted in which a width (width dimension) decreases toward one side ends 148a and 158a and the other side ends 148b and 158b which are located in the lengthwise direction, from the central portion in the extension direction (lengthwise direction).

In addition, as indicated by a chain double-dashed line in FIG. 10, the inner wall surface of the concave portion 248 may be a curved inner wall surface 242a, and exhibits the same effects. Although not shown in the drawing, the inner wall surface may be a curved inner wall surface 252a, similar to the inner surface of the concave portion 258.

According to the tuning fork type vibrator element 200 of the second embodiment, it is possible to easily form a drive electrode disposed on the inner surfaces of the concave portions 248 and 258 and to achieve a reduction in manufacturing costs while maintaining vibration characteristics, in addition to the effects of the first embodiment.

Third Embodiment

Figure 11:
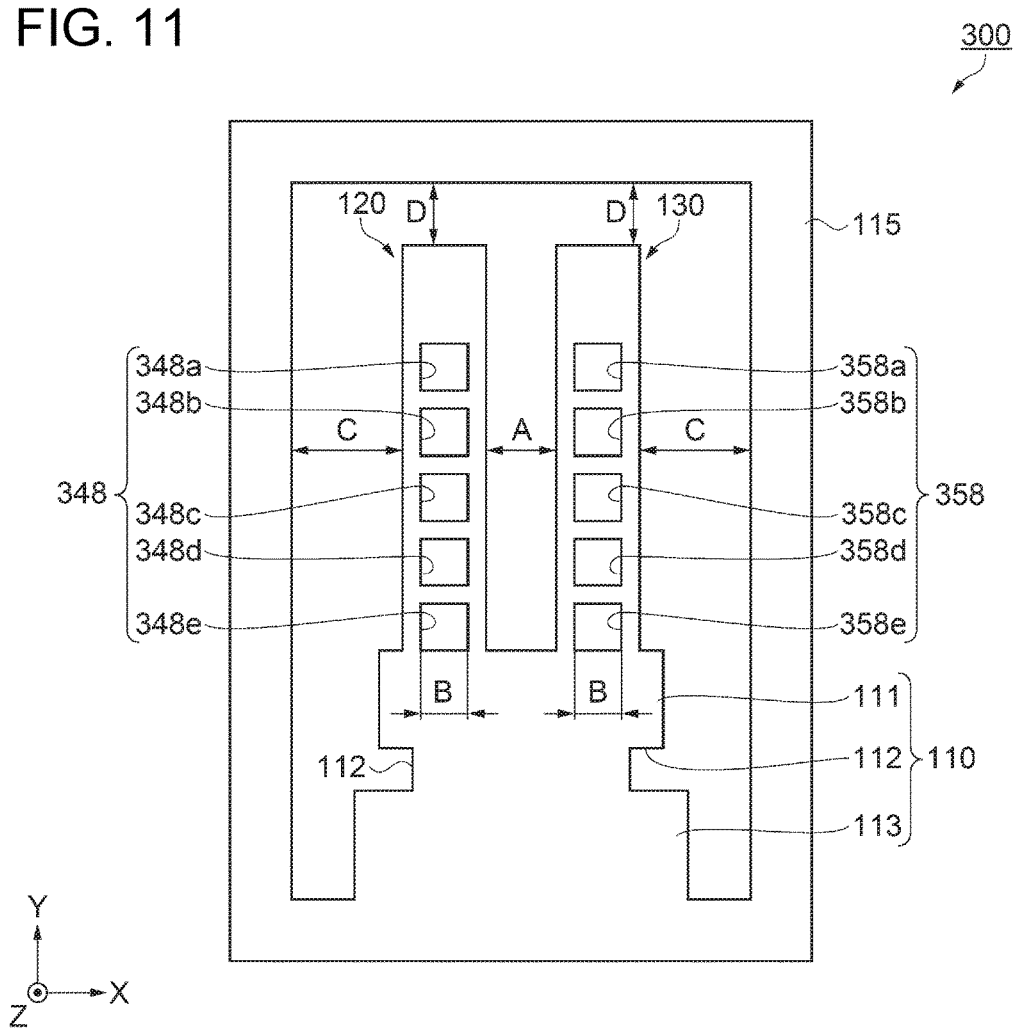
FIG. 11 is a schematic plan view showing a configuration of a tuning fork type vibrator element of an electronic component (vibrator device) according to a third embodiment.

Next, a schematic configuration of a tuning fork type vibrator element of an electronic component (vibrator device) according to a third embodiment will be described with reference to FIG. 11. FIG. 11 is a schematic plan view showing a configuration of the tuning fork type vibrator element of the electronic component (vibrator device) according to the third embodiment. Meanwhile, in FIG. 11, for convenience of description, an electrode such as a drive electrode is not shown. Hereinafter, the same components as those in the above-described first embodiment are denoted by the same reference numerals and signs, and thus a description thereof will not be repeated.

As shown in FIG. 11, a tuning fork type vibrator element 300 according to the third embodiment includes a base 110, a pair of vibrator arms 120 and 130 that extend so as to protrude from the base 110 in the +Y-axis direction, and a frame 115 that extends from the base 110 and surrounds the vibrator arms 120 and 130, similar to the first embodiment. Meanwhile, details of a configuration of the tuning fork type vibrator element 200 are the same as those in the first embodiment, and thus a description thereof will not be repeated. The tuning fork type vibrator element 300 according to the third embodiment is different from the tuning fork type vibrator element 100 according to the first embodiment in terms of configurations of concave portions 348 and 358 respectively provided in the vibrator arms 120 and 130. Hereinafter, a description will be given focusing on the concave portions 348 and 358 configured in a different manner.

The concave portion 348 provided in the vibrator arm 120 is configured such that a plurality of (five in this embodiment) bottomed concave portions 348a, 348b, 348c, 348d, and 348e that open to the surface or the rear surface thereof are disposed lined up at intervals in the longitudinal direction (lengthwise direction) of the vibrator arm 120. Similarly, the concave portion 358 provided in the vibrator arm 130 is configured such that a plurality of (five in this embodiment) bottomed concave portions 358a, 358b, 358c, 358d, and 358e that open to the surface or the rear surface thereof are disposed lined up at intervals in the longitudinal direction (lengthwise direction) of the vibrator arm 130. Meanwhile, each of the plurality of concave portions 348a to 348e and 358a to 358e can be configured to have the same cross-sectional shape as that in the above-described first embodiment.

In this manner, the concave portion 348 having the plurality of (five in this embodiment) concave portions 348a to 348e disposed lined up therein and the concave portion 358 having the plurality of (five in this embodiment) concave portions 358a to 358e disposed lined up therein are provided in the vibrator arm 120 and the vibrator arm 130, and thus it is possible to suppress deterioration in the strength of the vibrator arms 120 and 130 due to the provision of the concave portions 348 and 358 and to configure the tuning fork type vibrator element 300 capable of improving impact resistance to falling or the like.

Fourth Embodiment

Figure 12:
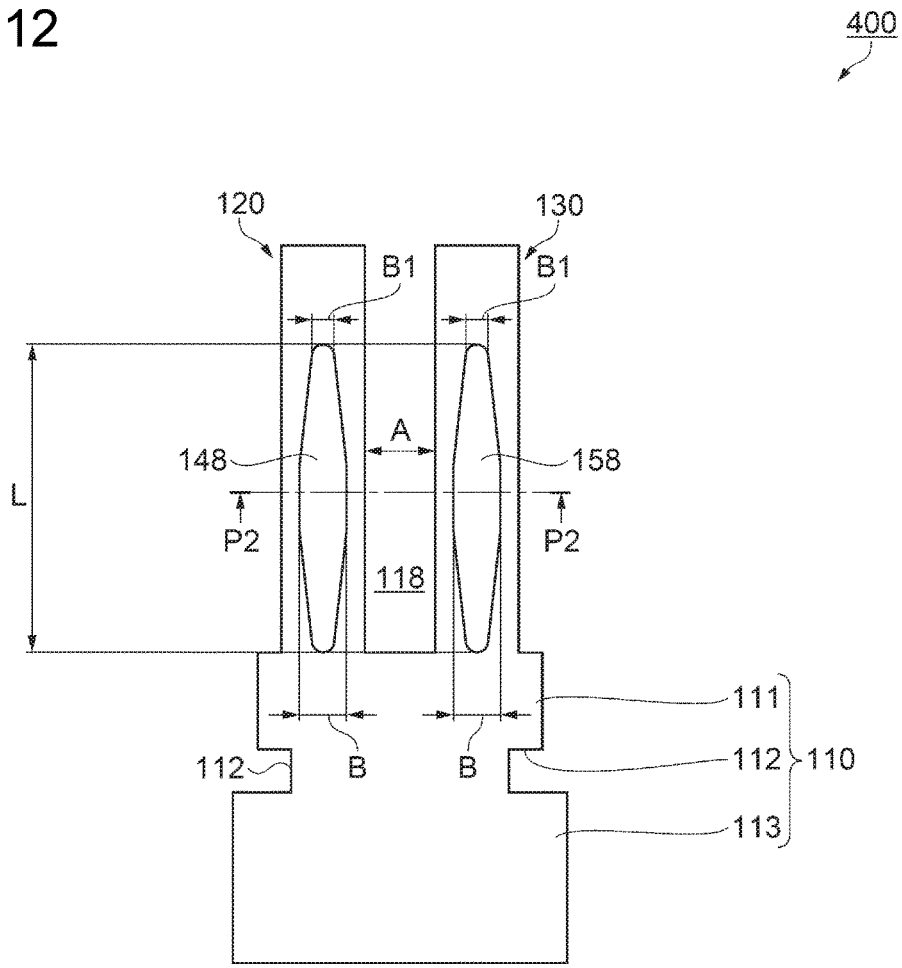
FIG. 12 is a schematic plan view showing a configuration of a tuning fork type vibrator element of an electronic component (vibrator device) according to a fourth embodiment.
Figure 12:
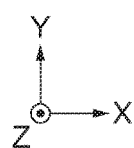
Figure 13:
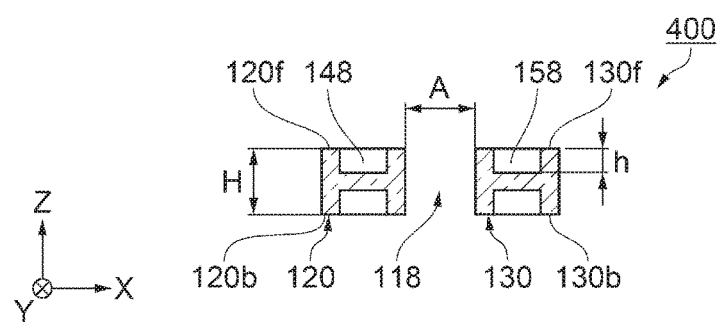
FIG. 13 is a cross-sectional view taken along line P2-P2 of FIG. 12.
Figure 13:
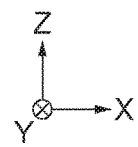

Next, a schematic configuration of a tuning fork type vibrator element of an electronic component (vibrator device) according to a fourth embodiment will be described with reference to FIGS. 12 and 13. FIG. 12 is a schematic plan view showing a configuration of the tuning fork type vibrator element of the electronic component (vibrator device) according to the fourth embodiment. FIG. 13 is a cross-sectional view taken along line P2-P2 of FIG. 12. Meanwhile, for convenience of description, an electrode such as a drive electrode is not shown in FIGS. 12 and 13. Hereinafter, the same components as those in the above-described first embodiment are denoted by the same reference numerals and signs, and thus a description thereof will not be repeated.

As shown in FIGS. 12 and 13, a tuning fork type vibrator element 400 according to the fourth embodiment includes a base 110 and a pair of vibrator arms 120 and 130 that protrude from the base 110 in the +Y-axis direction. The tuning fork type vibrator element 400 according to the fourth embodiment is configured such that the frame 115 provided in the tuning fork type vibrator element 100 of the first embodiment is not provided. The base 110 and the pair of vibrator arms 120 and 130 that are other components in the tuning fork type vibrator element 400 are the same as those in the tuning fork type vibrator element 100 of the first embodiment. Therefore, in the tuning fork type vibrator element 400, the same components as those in the first embodiment will not be described in detail.

Similarly to the first embodiment, the vibrator arms 120 and 130 are provided with the concave portions 148 and 158 that open to surfaces 120f and 130f or rear surfaces 120b and 130b of the vibrator arms 120 and 130. Meanwhile, regarding a description of the concave portions 148 and 158, the same matters as those in the first embodiment will not be described and different matters will be described. Openings of each of the concave portions 148 and 158 are configured such that a length (length dimension) L in a direction perpendicular to the width of the opening is larger than a width (width dimension) B of the opening, and the width (width dimension) B of the opening is smaller than an interval A which is the minimum width between side surfaces defining the exterior shape. Meanwhile, in a configuration in which an outer frame is not provided as in the tuning fork type vibrator element 400 of this embodiment, the interval A which is a distance between the paired vibrator arm 120 and vibrator arm 130 is equivalent to the minimum width between the side surfaces defining the exterior shape.

In this manner, also in the tuning fork type vibrator element 400 according to the fourth embodiment which is not provided with an outer frame, the same effects as those in the tuning fork type vibrator elements 100, 200, and 300 according to the above-described first to third embodiments can be exhibited.

Fifth Embodiment

Figure 14:
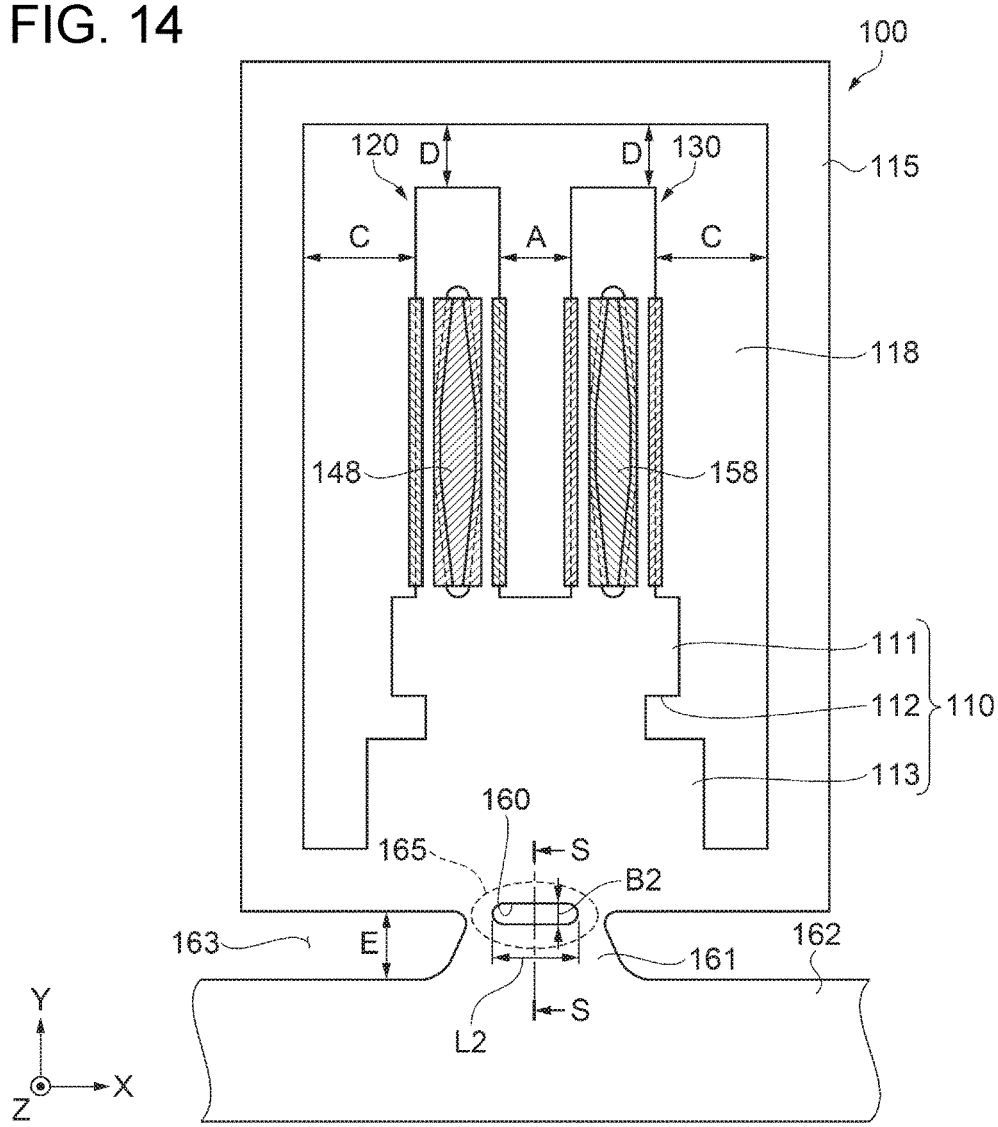
FIG. 14 is a schematic plan view showing a configuration of a tuning fork type vibrator element of an electronic component (vibrator device) according to a fifth embodiment.
Figure 15:
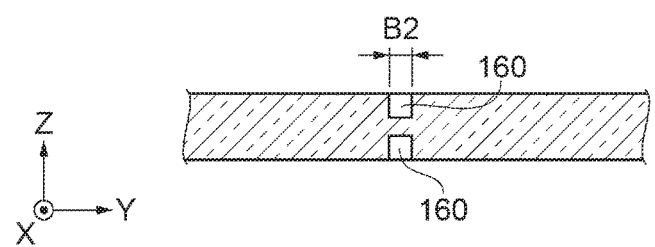
FIG. 15 is a cross-sectional view taken along line S-S of FIG. 14.

Next, a schematic configuration of a tuning fork type vibrator element of an electronic component (vibrator device) according to a fifth embodiment will be described with reference to FIGS. 14 and 15. FIG. 14 is a schematic plan view showing a configuration of the tuning fork type vibrator element of the electronic component (vibrator device) according to the fifth embodiment. FIG. 15 is a cross-sectional view taken along line S-S of FIG. 14. Meanwhile, for convenience of description, an electrode such as a drive electrode is not shown in FIGS. 14 and 15. Hereinafter, the same components as those in the above-described first embodiment are denoted by the same reference numerals and signs, and thus a description thereof will not be repeated.

As shown in FIGS. 14 and 15, a tuning fork type vibrator element 100 according to the fifth embodiment includes a base 110 and a pair of vibrator arms 120 and 130 that protrude from the base 110 in the +Y-axis direction. The tuning fork type vibrator element 100 is connected to a supporting frame 162 of a quartz crystal wafer (not shown) through a break-off portion 161. Meanwhile, a plurality of tuning fork type vibrator elements 100 can be arranged on the quartz crystal wafer to be connected to each other. In this embodiment, the break-off portion 161 is provided with a concave portion 160 that opens to the surface and the rear surface thereof. The concave portion 160 is provided in a connection portion 165 which is a portion that connects the break-off portion 161 and the frame 115 to each other, and, for example, a bottomed groove along the X-axis in this embodiment is provided along the break-off shape so as to extend. Meanwhile, the depth of the concave portion 160 may be fixed or may be substantially fixed, or may be formed to be reduced toward both ends thereof. The depth of the concave portion 160 at both ends thereof can be easily set by using a dry etching method. As an example, in the concave portion 160 in this embodiment, it is possible to make the depth at both ends of the concave portion 160 smaller than the depth of the central portion thereof by reducing the width thereof when seen in a plan view toward both ends thereof.

The opening of the concave portion 160 that opens to the surface and rear surface thereof are configured such that a length (length dimension) L2 in a direction perpendicular to the width of the opening is set to be larger than a width (width dimension) B2 of the opening, and the width (width dimension) B2 of the opening is set to be smaller than an interval D (interval E in a case where an interval E constituting the notch 163 is a minimum width) which is the minimum width between side surfaces defining the exterior shape.

The break-off portion 161 including the concave portion 160 is provided, and thus the strength of the connection portion 165 becomes lower than that of the break-off portion 161 or the base 110. Accordingly, when the tuning fork type vibrator element 100 is broken off (separated) from the supporting frame 162 of the quartz crystal wafer (not shown), the break-off can be easily and reliably performed. In addition, it is possible to reduce variations in shape (break-off shape) after the break-off.

In addition, also in the break-off portion 161 including the concave portion 160, it is possible to form a notch 118 and supporting frame 162 as a penetration portion, a notch 163 between the supporting frame 162 and the outer frame 115, and the bottomed (non-penetration) concave portion 160 by the same dry etching processing, similar to the concave portions 148 and 158 provided in the vibrator arms 120 and 130 of the above-described first embodiment, to solve complication in a processing step on the vibrator device (the tuning fork type vibrator element 100 as a vibrator element), and to contribute to a reduction in the number of processes.

Sixth Embodiment

Figure 16:
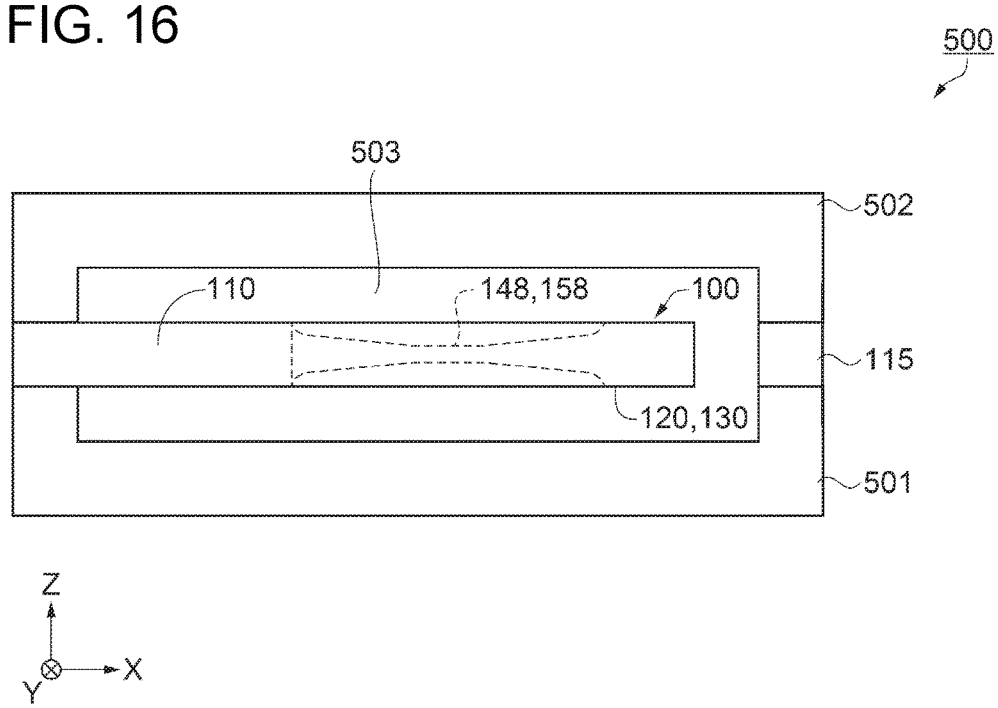
FIG. 16 is a schematic front cross-sectional view showing a configuration of a vibrator of an electronic component (vibrator device) according to a sixth embodiment.

Next, a schematic configuration of a vibrator of an electronic component (vibrator device) according to a sixth embodiment will be described with reference to FIG. 16. FIG. 16 is a schematic front cross-sectional view showing a configuration of the vibrator of the electronic component (vibrator device) according to the sixth embodiment.

As shown in FIG. 16, a vibrator 500 of an electronic component (vibrator device) according to the sixth embodiment includes a base 501 including an outer peripheral wall, the tuning fork type vibrator element 100 according to the first embodiment in which the frame 115 is disposed on the outer peripheral wall of the base 501, and a cover body 502 which is disposed on the frame 115 of the tuning fork type vibrator element 100 and defines a storage space 503 between the base 501 and the cover body. In this manner, the vibrator 500 is configured such that a package is defined by the base 501, the frame 115 of the tuning fork type vibrator element 100, and the cover body 502 and at least the vibrator arms 120 and 130 of the tuning fork type vibrator element 100 are accommodated in the storage space 503 within the package. The vibrator arms 120 and 130 of the tuning fork type vibrator element 100 are provided with concave portions 148 and 158.

The base 501 and the cover body 502 are formed of a quartz crystal material. The base 501 can be bonded to one surface (rear surface) of the frame 115 of the tuning fork type vibrator element 100 by siloxane bonding (Si—O—Si). Similarly, the base can be bonded to the other surface (surface) of the frame 115 of the tuning fork type vibrator element 100 by siloxane bonding (Si—O—Si). Meanwhile, this bonding can be performed using anodic bonding or resin bonding depending on materials for forming the base 501, the tuning fork type vibrator element 100, and the cover body 502, other than the siloxane bonding.

In addition, an outer bottom surface (outer surface in the −Z-axis direction) of the base 501 constituting the package is provided with an external connection terminal (not shown) including a terminal which is electrically connected to a drive electrode (not shown) of the tuning fork type vibrator element 100.

According to the vibrator 500 of the sixth embodiment, the tuning fork type vibrator element 100 is provided with the vibrator arms 120 and 130 respectively including the concave portions 148 and 158, and thus it is possible to provide stiffness to torsional deformation and the like and to achieve efficient flexural vibration. In addition, in the vibrator 500, a vibration portion of the tuning fork type vibrator element 100 is accommodated in the package defined by the base 501, the frame 115, and the cover body 502, and thus it is possible to realize a low (thin) vibrator.

Meanwhile, in the above-described sixth embodiment, an example in which the tuning fork type vibrator element 100 of the first embodiment is used has been described, but the invention is not limited thereto. Any one of the tuning fork type vibrator element 200 of the second embodiment, the tuning fork type vibrator element 300 of the third embodiment, and the tuning fork type vibrator element 400 of the fourth embodiment may be used.

Seventh Embodiment

Figure 17:
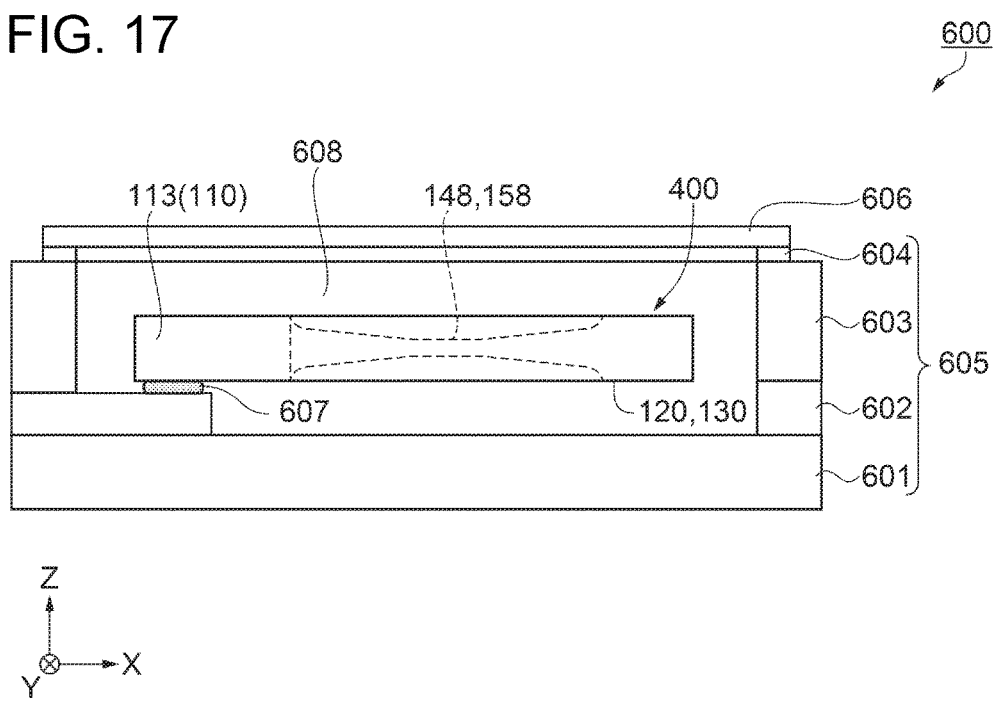
FIG. 17 is a schematic front cross-sectional view showing a configuration of a vibrator of an electronic component (vibrator device) according to a seventh embodiment.

Next, a schematic configuration of a vibrator of an electronic component (vibrator device) according to a seventh embodiment will be described with reference to FIG. 17. FIG. 17 is a schematic front cross-sectional view showing a configuration of the vibrator of the electronic component (vibrator device) according to the seventh embodiment.

As shown in FIG. 17, a vibrator 600 of an electronic component (vibrator device) according to the seventh embodiment includes the tuning fork type vibrator element 400 according to the fourth embodiment, a package 605 that accommodates the tuning fork type vibrator element 400, and a lid 606 as a cover body. The vibrator arms 120 and 130 of the tuning fork type vibrator element 400 are provided with the concave portions 148 and 158.

The package 605 is provided with a first substrate 601 having a flat plate shape and a concave portion in which a second substrate 602 having a frame shape, a third substrate 603 constituting a frame-shaped wall portion, and a seal ring 604 are sequentially stacked on and firmed fixed onto the first substrate 601, and the tuning fork type vibrator element 400 is accommodated. The first substrate 601, the second substrate 602, and the third substrate 603 are formed of, for example, ceramics. In addition, the seal ring 604 is formed by punching, for example, a Kovar alloy into a rectangular annular shape.

The tuning fork type vibrator element 400 is connected to the upper surface of the second substrate 602. The second substrate 602 is formed to have a frame shape including an opening having such a size that the first substrate 601 and a vibration unit including the vibrator arms 120 and 130 of the tuning fork type vibrator element 400 do not come into contact with each other. The third substrate 603 is formed to have a frame shape including an opening larger than the opening of the second substrate 602, and is stacked on and firmed fixed onto the second substrate 602. A connection pad not shown in the drawing is disposed on the upper surface of the second substrate 602, having the third substrate 603 stacked thereon, which is shown on the inner side of the opening of the third substrate 603, and the tuning fork type vibrator element 400 is connected to the connection pad using a conductive adhesive 607 or the like.

Further, the lid 606 as a cover body is disposed on the seal ring 604 provided on the upper surface of the opening of the third substrate 603, the opening of the package 605 is sealed, and the inside (storage space 608) of the package 605 is airtightly sealed, thereby obtaining the vibrator 600. The lid 606 may be formed of a metal, such as a 42 alloy (an alloy of iron containing nickel of 42%) or Kovar (an alloy of iron, nickel, and cobalt), ceramics, glass, or the like. In a case where the lid 606 is formed of, for example, a metal, the lid is bonded to the package 605 by seam welding through the seal ring 604 which is formed by punching a Kovar alloy or the like into a rectangular annular shape. The storage space 608 formed by the package 605 and the lid 606 is a space for the operation of the tuning fork type vibrator element 400, and thus it is preferable to tightly cover and seal the storage space in a decompressed space.

According to the vibrator 600 of the seventh embodiment, the tuning fork type vibrator element 100 includes the vibrator arms 120 and 130 including the concave portions 148 and 158, and thus it is possible to provide stiffness to torsional deformation and the like and to achieve efficient flexural vibration. In addition, since the vibrator 600 is formed using the package 605 such as ceramics which is capable of easily obtained, and thus it is possible to configure the vibrator 600 at a low cost.

Meanwhile, in the above-described seventh embodiment, an example in which the tuning fork type vibrator element 400 of the fourth embodiment is used has been described, but the invention is not limited thereto. Any one of the tuning fork type vibrator element 100 of the first embodiment, the tuning fork type vibrator element 200 of the second embodiment, and the tuning fork type vibrator element 300 of the third embodiment may be used.

Meanwhile, in the above-described embodiments, the tuning fork type vibrator elements 100, 200, 300, and 400 which are timing devices have been described as vibration elements, but the invention is not limited thereto. Examples of a vibration element to which the invention is applicable include a gyro sensor element that detects an angular velocity, a pressure sensor element that measures pressure, and the like. In addition, the invention can be applied to an oscillator or a sensor device in which a vibration element, a circuit element oscillating the vibration element, and the like are accommodated in a package.

Electronic Apparatus

Subsequently, an electronic apparatus having any one of the tuning fork type vibrator elements 100, 200, 300, and 400 as electronic components (vibrator devices) and the vibrators 500 and 600 applied thereto will be described in detail with reference to FIGS. 18 to 20. Meanwhile, in the following description, an example in which the tuning fork type vibrator element 100 is applied will be described.

Figure 18:
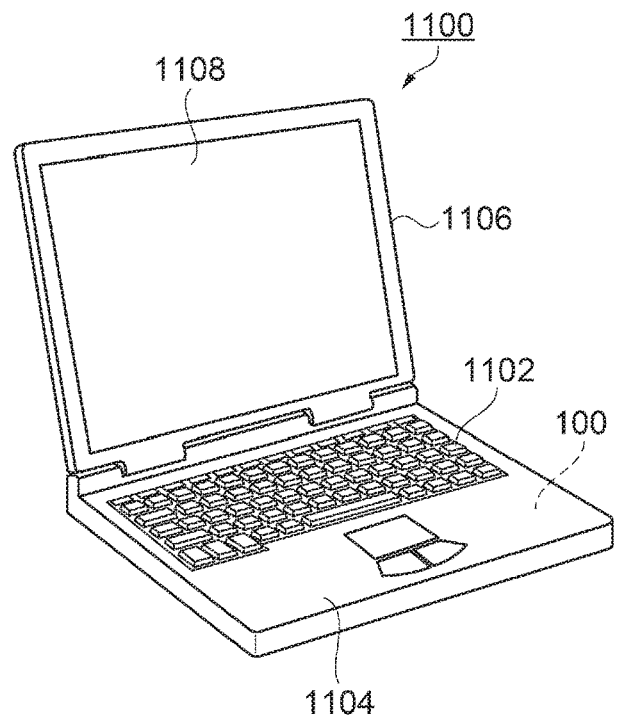
FIG. 18 is a perspective view showing a configuration of a mobile personal computer as an example of an electronic apparatus.

FIG. 18 is a perspective view showing a configuration of a mobile (or notebook) personal computer as an example of an electronic apparatus including the tuning fork type vibrator element 100 of the electronic component (vibrator device) according to the invention according to an embodiment. In this diagram, a personal computer 1100 is configured to include a main body 1104 having a keyboard 1102 and a display unit 1106 having a display portion 1108, and the display unit 1106 is supported so as to be rotatable with respect to the main body 1104 through a hinge structure. The tuning fork type vibrator element 100 having a function as a timing source of signal processing is incorporated into the personal computer 1100.

Figure 19:
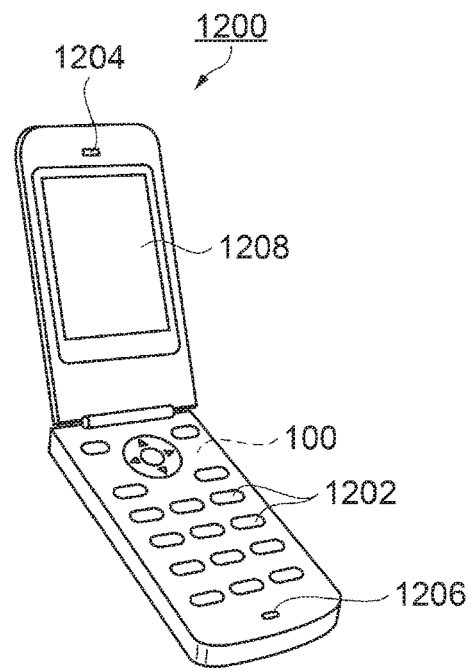
FIG. 19 is a perspective view showing a configuration of a mobile phone as an example of an electronic apparatus.

FIG. 19 is a perspective view showing a configuration of a mobile phone (a PHS is also included) as an electronic apparatus including the tuning fork type vibrator element 100 of the electronic component (vibrator device) according to the invention according to an embodiment. In this diagram, a mobile phone 1200 includes a plurality of operation buttons 1202, an earpiece 1204, and a mouthpiece 1206, and the display portion 1208 is disposed between the operation buttons 1202 and the earpiece 1204. The tuning fork type vibrator element 100 having a function as a timing source of signal processing is incorporated into the mobile phone 1200.

Figure 20:
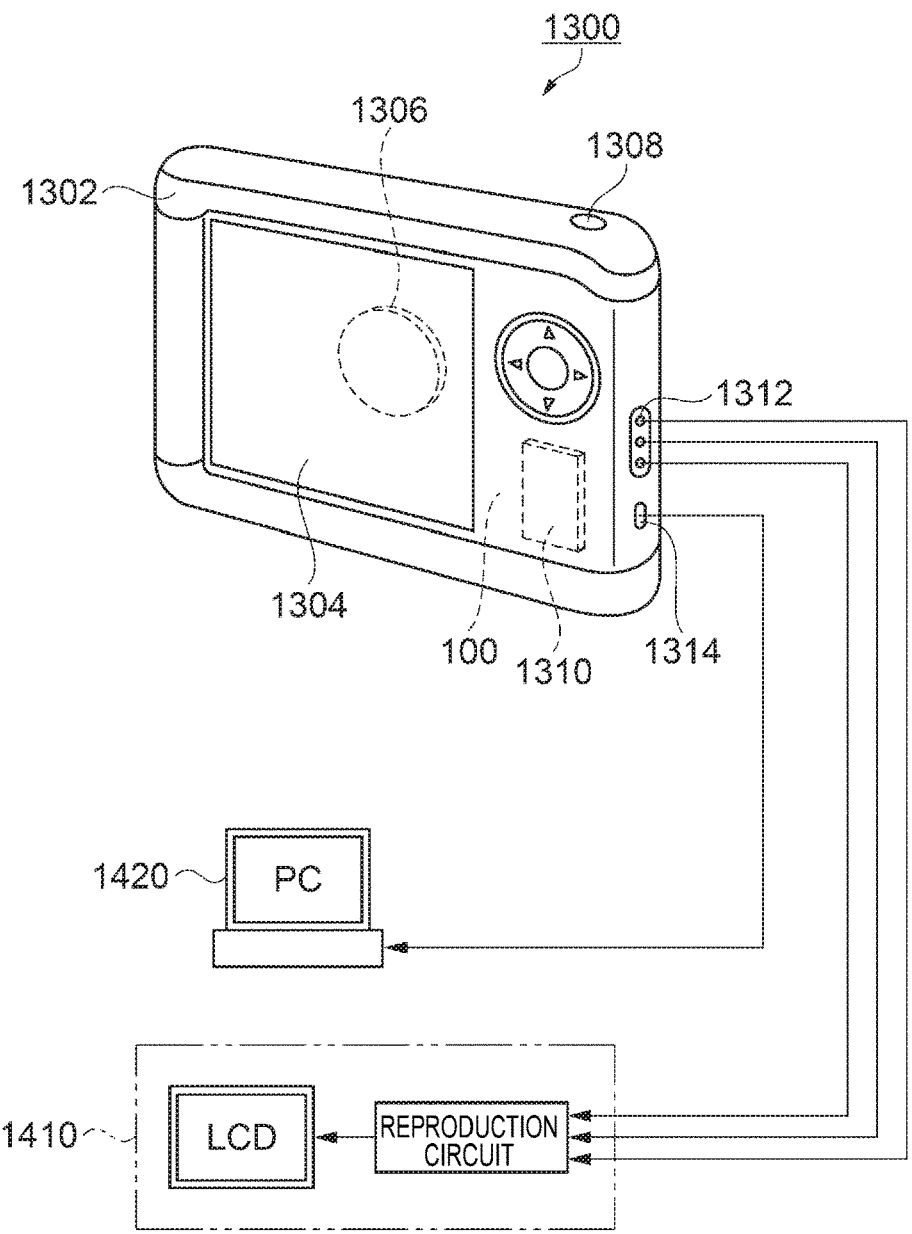
FIG. 20 is a perspective view showing a configuration of a digital still camera as an example of an electronic apparatus.

FIG. 20 is a perspective view showing a configuration of a digital still camera as an electronic apparatus including the tuning fork type vibrator element 100 of the electronic component (vibrator device) according to the invention according to an embodiment. Meanwhile, connection with an external device is simply shown in this diagram. Here, a silver halide photograph film is exposed to light according to an optical image of a subject in a film camera of the related art, while a digital still camera 1300 generates an imaging signal (image signal) by performing photoelectric conversion of an optical image of a subject using an imaging element, such as a charge coupled device (CCD).

A display portion 1304 is provided on the back of a case (body) 1302 in the digital still camera 1300, so that display based on the imaging signal of the CCD is performed. The display portion 1304 functions as a viewfinder that displays a subject as an electronic image. In addition, a light receiver 1306 including an optical lens (imaging optical system), a CCD, and the like is provided on the front side (back side in FIG. 20) of the case 1302.

When a photographer checks a subject image displayed on the display portion 1304 and presses a shutter button 1308, an imaging signal of the CCD at that point in time is transferred and stored in a memory 1310. In addition, in the digital still camera 1300, a video signal output terminal 1312 and an input/output terminal for data communication 1314 are provided on the side surface of the case 1302. In addition, as shown in the drawing, a television monitor 1410 is connected to the video signal output terminal 1312 and a personal computer 1420 is connected to the input/output terminal for data communication 1314 when necessary. In addition, an imaging signal stored in the memory 1310 may be output to the television monitor 1410 or the personal computer 1420 by a predetermined operation. The tuning fork type vibrator element 100 having a function as a timing source of signal processing is incorporated into the digital still camera 1300.

Meanwhile, the tuning fork type vibrator element 100 according to the electronic component (vibrator device) according to the invention according to an embodiment can be applied not only to the personal computer (mobile personal computer) of FIG. 18, the mobile phone of FIG. 19, and the digital still camera of FIG. 20 but also to electronic devices such as ink jet type discharge apparatus (for example, an ink jet printer), a laptop type personal computer, a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish detector, various measurement apparatuses, instruments (for example, instruments for automobiles, aircraft, and ships), and a flight simulator.

Vehicle

Figure 21:
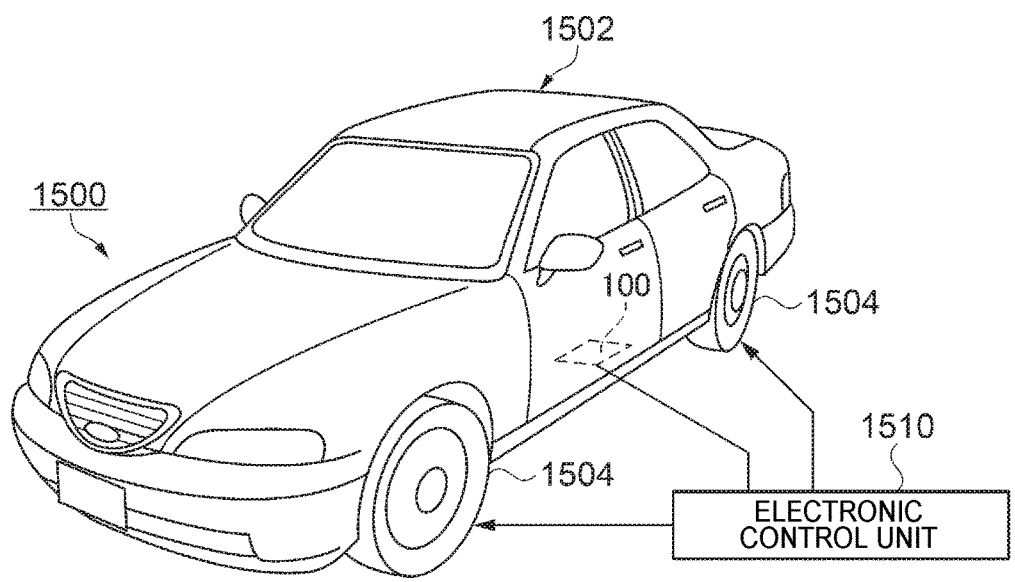
FIG. 21 is a perspective view showing a configuration of an automobile as an example of a vehicle.

Subsequently, a vehicle having any one of the tuning fork type vibrator elements 100, 200, 300, and 400 of the electronic component (vibrator device) according to the invention according to an embodiment and the vibrators 500 and 600 applied thereto will be described in detail with reference to FIG. 21. Meanwhile, in the following description, an example in which the tuning fork type vibrator element 100 is applied will be described. FIG. 21 is a schematic perspective view showing an automobile as an example of a vehicle. The automobile 1500 is mounted with the tuning fork type vibrator element 100 according to the invention. For example, as shown in the drawing, in the automobile 1500 as a vehicle, an electronic control unit 1510 having the tuning fork type vibrator element 100 embedded therein and controlling a tire 1504 and the like is mounted in a car body 1502. In addition, the tuning fork type vibrator element 100 can be widely applied to an electronic control unit (ECU) such as a keyless entry, an immobilizer, a car navigation system, a car air-conditioner, an anti-lock brake system (ABS), an airbag, a tire pressure monitoring system (TPMS), an engine control, a battery monitor of a hybrid vehicle or an electric vehicle, or a vehicle body position control system.

What is claimed is:

1. An electronic component manufacturing method in which a notch and a concave portion are formed in a substrate, the method comprising:
   forming an etching mask in which a maximum width of a first mask portion which forms a width between two side surfaces of the concave portion along a longitudinal direction, when the substrate is seen in a plan view from a direction perpendicular to a surface of the substrate having the concave portion formed therein, is smaller than a width of a second mask portion which forms a minimum width of an opening of the notch; and
   forming the notch and the concave portion by performing dry etching processing on the substrate.

2. The method according to claim 1,
   wherein the forming of the notch and the concave portion includes forming the notch and the concave portion in parallel.

3. The method according to claim 1,
   wherein the forming of the etching mask includes forming the first mask portion so that the width between the two side surfaces becomes smaller toward an end of an opening of the concave portion in the longitudinal direction.

4. The method according to claim 1,
   wherein the forming of the etching mask includes forming the first mask portion and the second mask portion so that the minimum width of the opening of the notch becomes larger than the maximum width between the two side surfaces of the concave portion by equal to or greater than 10 μm, and a minimum width between the two side surfaces of the concave portion is set to equal to or less than 50 μm.

5. The method according to claim 1,
   wherein the forming of the etching mask includes forming the first mask portion so that the minimum width of the concave portion is set to equal to or less than 30 μm.

6. The method according to claim 1,
wherein the electronic component is a vibrator element that includes a base and a vibrator arm, and
wherein the forming of the notch and the concave portion includes forming a notch defining exteriors of the base and the vibrator arm on the substrate and forming the concave portion in the vibrator arm, and further includes forming an electrode in the vibrator arm after the notch and the concave portion are formed.

* * * * *